United States Patent [19]

Ikeno

[11] Patent Number: 5,264,246
[45] Date of Patent: Nov. 23, 1993

[54] SPIN COATING METHOD

[75] Inventor: Masahiko Ikeno, Itami, Japan

[73] Assignee: Mitsubishi Denki Kabushiki Kaisha, Tokyo, Japan

[21] Appl. No.: 823,111

[22] Filed: Jan. 21, 1992

Related U.S. Application Data

[62] Division of Ser. No. 516,734, Apr. 30, 1990, Pat. No. 5,095,848.

[30] Foreign Application Priority Data

May 2, 1989 [JP] Japan ................... 1-112183
Sep. 1, 1989 [JP] Japan ................... 1-224570

[51] Int. Cl.⁵ ............................. B05D 3/12
[52] U.S. Cl. ........................ 427/240; 427/335; 427/346; 427/377; 427/385.5; 437/231
[58] Field of Search .......... 427/240, 377, 385.5, 427/335, 346, 336; 437/231

[56] References Cited

U.S. PATENT DOCUMENTS

| | | | |
|---|---|---|---|
| 3,858,547 | 1/1975 | Bergfelt | 118/49 |
| 4,124,411 | 11/1978 | Meuleman et al. | 136/89 TF |
| 4,528,934 | 7/1985 | Nakayama | 118/52 |
| 4,741,926 | 5/1988 | White | 427/240 |
| 4,806,504 | 2/1989 | Cleeves | 427/240 |
| 4,822,639 | 4/1989 | Fujii et al. | 427/240 |

FOREIGN PATENT DOCUMENTS

| | | |
|---|---|---|
| 46-10790 | 3/1971 | Japan . |
| 52-47836 | 4/1977 | Japan . |
| 53-72464 | 6/1978 | Japan . |
| 55-36923 | 3/1980 | Japan . |
| 57-107032 | 7/1982 | Japan . |
| 60-42729 | 3/1985 | Japan . |
| 60-42762 | 3/1985 | Japan . |
| 60-130830 | 7/1985 | Japan . |
| 60-161767 | 8/1985 | Japan . |
| 60-189934 | 9/1985 | Japan . |
| 60-226125 | 11/1985 | Japan . |
| 61-29125 | 2/1986 | Japan . |
| 61-51633 | 3/1986 | Japan . |
| 61-125017 | 6/1986 | Japan . |
| 61-206221 | 9/1986 | Japan . |
| 61-207019 | 9/1986 | Japan . |
| 61-246990 | 11/1986 | Japan . |
| 61-291068 | 12/1986 | Japan . |
| 62-219522 | 9/1987 | Japan . |
| 63-54725 | 3/1988 | Japan . |

OTHER PUBLICATIONS

R. H. Wilson and P. A. Piacente, "Effect Circuit Structure"... vol. 133, Journal of Electricalchemical Society, May 1986, pp. 981 ∝ 984.

L. E. Stillwagon, R. G. Larson, and G. N. Taylor, Planarization of Substrate Topography ... vol. 134, Journal of Electricalchemical Society, 1987, pp. 2030–2037 (no month available).

L. K. White and N. Miszkowski, Topography-induced Thickness ... Journal Vacuum Science Society, B. vol. 3 1985, pp. 862–868 (no month available).

Primary Examiner—Janyce Bell
Attorney, Agent, or Firm—Leydig, Voit & Mayer

[57] ABSTRACT

A spin coating method includes the steps of applying a coating material on the surface of a substrate, rotating the substrate about a first axis, and revolving the substrate about a second axis while tilting the substrate towards the second axis. The rotating step spreads the coating material over the surface of the substrate, and the step of revolving while tilting the substrate smoothens the surface of the coating material. At least the rotating step may be performed in an atmosphere containing a solvent vapor. A spin coating apparatus includes a nozzle for applying a coating-material to the surface of a substrate, a chuck for rotating the substrate about a first axis, a support arm for revolving the substrate about a second axis, and a tilting mechanism for tilting the surface of the substrate towards the center of the second axis while the substrate is revolving.

10 Claims, 25 Drawing Sheets

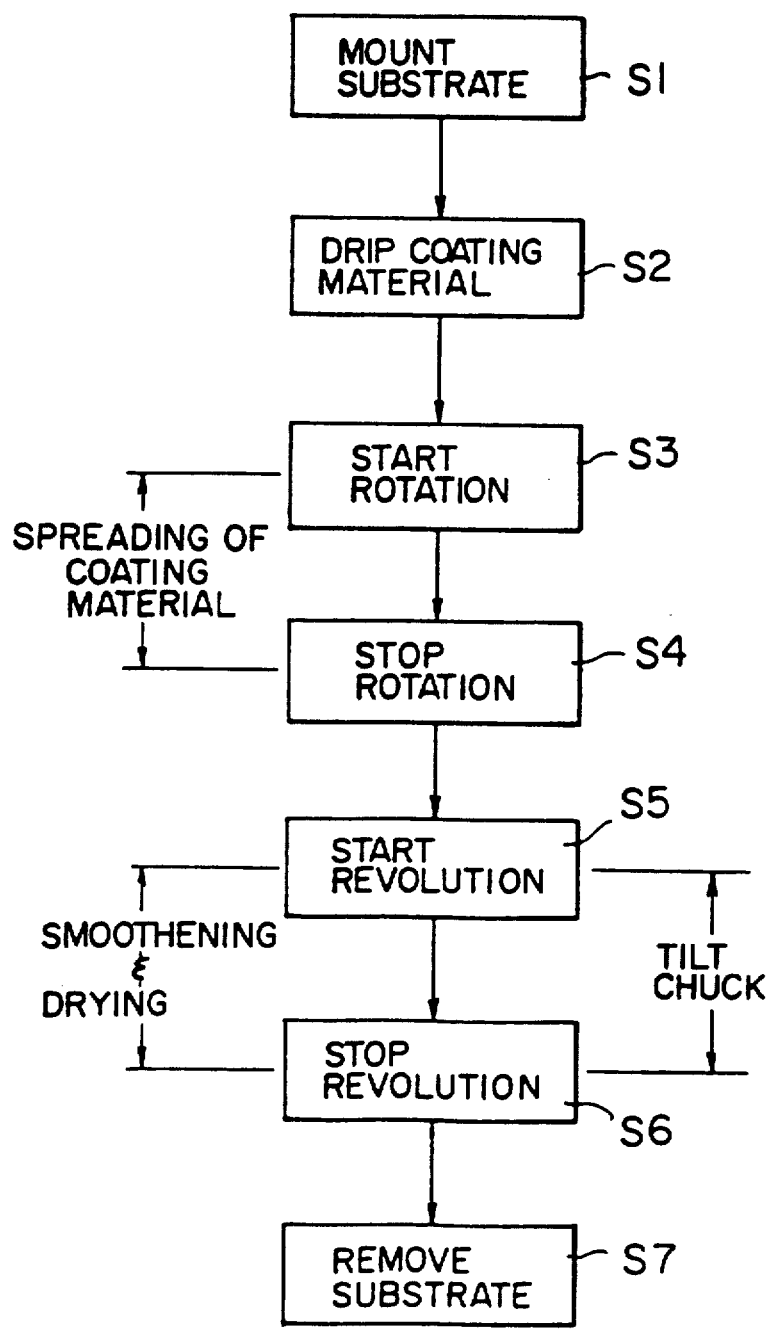

F I G. 6(a)
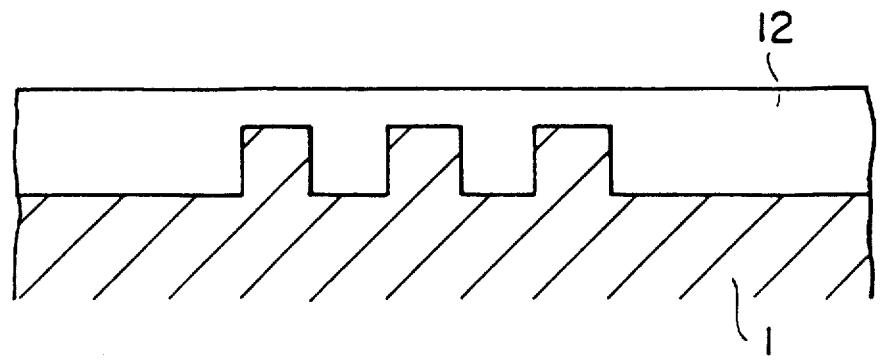
F I G. 6(b)
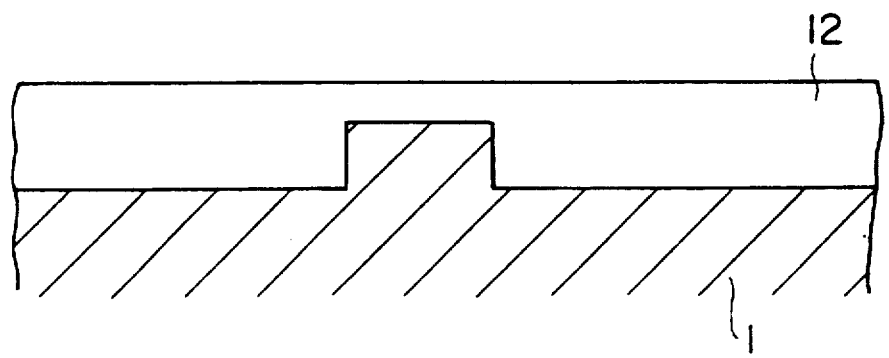
F I G. 6(c)
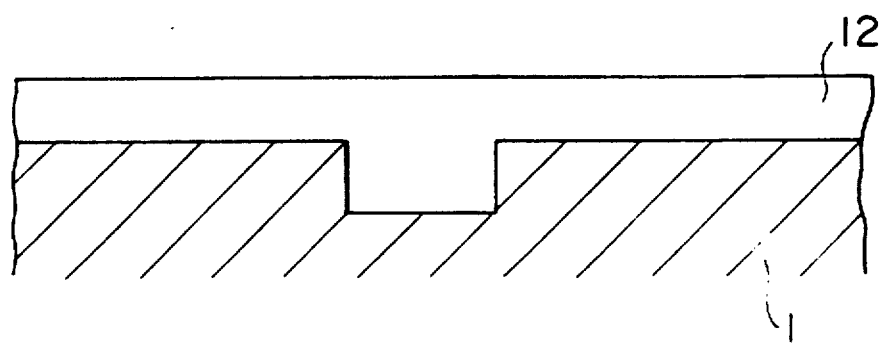

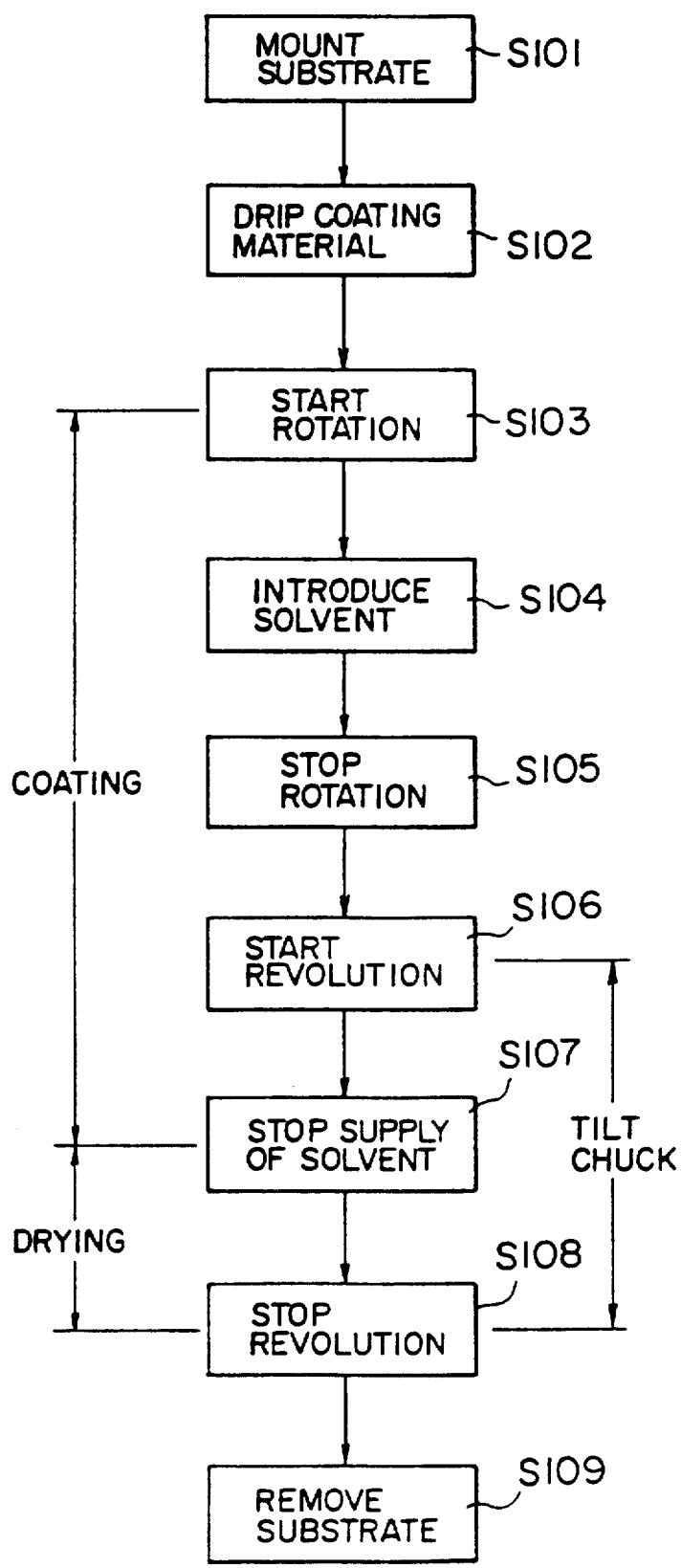

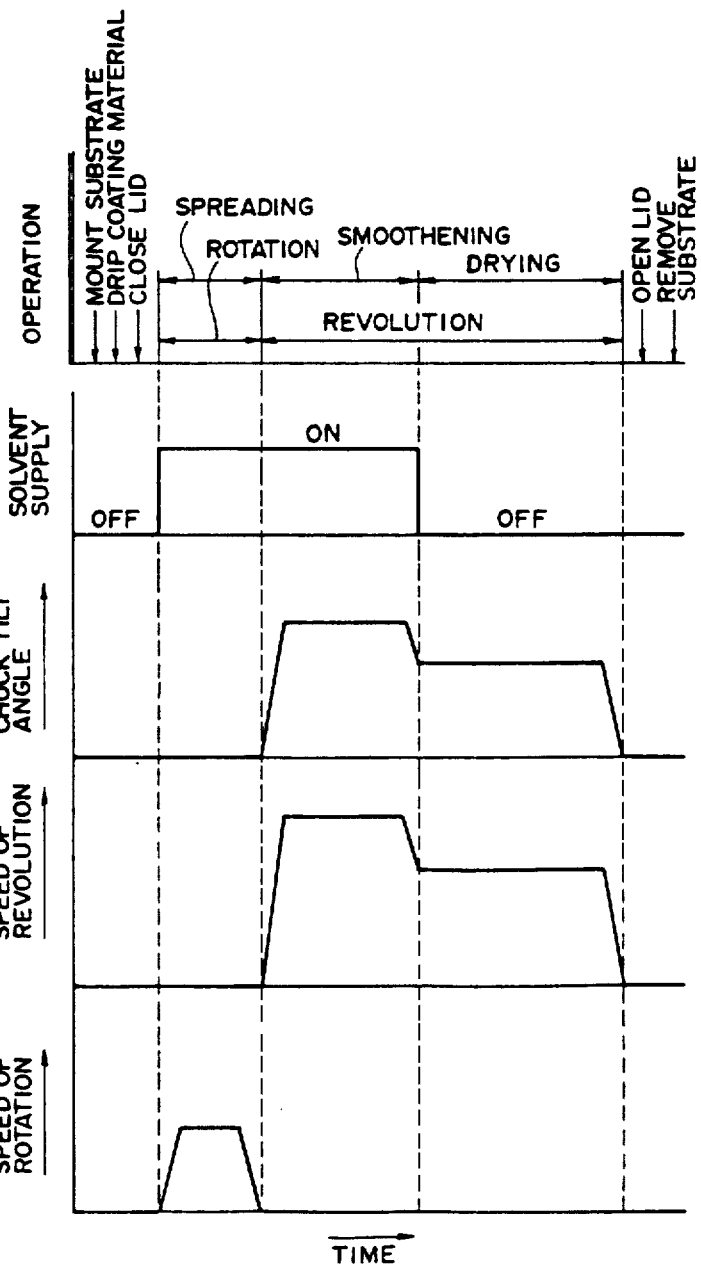
F I G. 9(a)
F I G. 9(b)
F I G. 9(c)
F I G. 9(d)
F I G. 9(e)

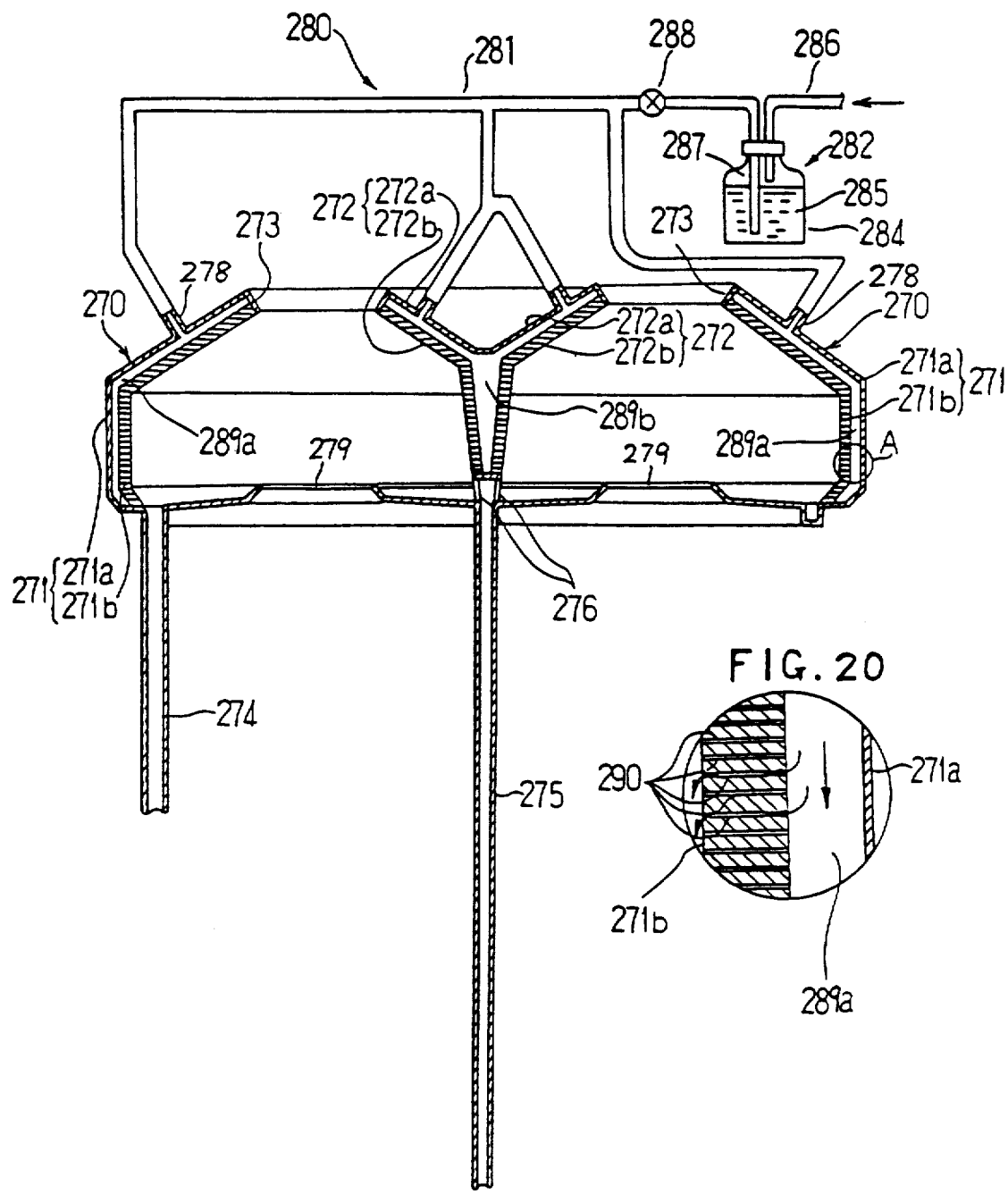

SPIN COATING METHOD

This application is a division of application Ser. No. 07/516,734, filed Apr. 30, 1990 now U.S. Pat. No. 5,095,848.

BACKGROUND OF THE INVENTION

This invention relates to a spin coating method for forming a thin film on the surface of a semiconductor substrate. It also relates to an apparatus for carrying out this method.

In the manufacture of semiconductor devices, there are many manufacturing steps which require the formation of a thin film on the surface of a semiconductor substrate such as a silicon wafer. For example, in photolithography, which is used to form fine patterns on a silicon wafer, a photosensitive polymeric film called a photoresist is formed on the wafer. In the manufacture of semiconductor imaging devices such as color image sensors, a minute color separation filter called an on-chip filter is formed on a substrate using a certain type of polymer. The most common method for forming thin films of these types is the spin coating method.

In the spin coating method, a substrate which is to be coated is mounted on a chuck which can be rotated by a spindle. The chuck has a support surface which supports the substrate in a horizontal plane. The substrate is generally held rigidly in place on the support surface by suction. A liquid coating material is dripped onto the center of the substrate through a nozzle, and the chuck is then rotated by the spindle at a high speed. Centrifugal force acting on the coating material causes it to spread outwards over the entire surface of the substrate. Excess coating material is flung off the spinning substrate.

The coating material generally contains a solvent. As the spinning continues, the solvent in the coating material vaporizes, and the viscosity of the coating material increases. Gradually, most of the solvent in the coating material vaporizes, the flow of the coating material stops, and a thin film is formed on the substrate.

The manufacture of a semiconductor device requires the formation of a large number of grooves and protrusions in the surface of a substrate. FIG. 25 illustrates a typical silicon wafer 401. A plurality of chips 402 separated by scribe lines 403 are formed on the wafer 401. The scribe lines 403 generally have a depth which is about 1-5 microns less than the thickness of the chips 402, and they have a width on the order of 50-100 microns. When a wafer 401 having surface irregularities such as these scribe lines 403 is subjected to spin coating by conventional methods, the outward flow of the coating liquid is disturbed by the scribe lines 403, and radial irregularities 404 in the film thickness are produced, resulting in a wavy surface. These irregularities 404 develop even when the scribe lines 403 are relatively small, such as on the order of several tenths of a micron up to several microns in size.

When surface irregularities of this type are formed in a photoresist film, they reduce the dimensional accuracy of the pattern which is formed by exposing and developing this film. At times, the irregularities are the cause of breakage of wires in the pattern or of short circuits. Furthermore, when irregularities are formed in an on-chip color filter for a color image sensor, the spectral response characteristics of the filter become nonuniform and vary from filter to filter.

FIGS. 26a through 26c are schematic cross-sectional views of the surfaces of photoresist films formed by spin coating on substrates having three different types of surface irregularities. FIG. 26a shows a pattern of protrusions 502 which is formed on the surface of a substrate 501. The pattern is used for indexing during the exposure stage of photolithography. The surface of a photoresist film 503 which is formed on this pattern contains wave-shaped undulations resulting from the protrusions 502 in the pattern. The peaks 503a and valleys 503b of the surface undulations are not centered over the protrusions 502 and spaces between the protrusions 502. Namely, the center of each peak 503a or valley 503b is slightly deviated from the center of each protrusion 502 or space. This deviation is caused by the flow of the coating material used to form the film 503 during spin coating. In photolithography, the protrusions 502 and spaces in the pattern are detected by a laser beam which is used for indexing an exposure pattern. The asymmetry of the undulations with respect to the protrusions 502 in the pattern has the undesirable effect of displacing the laser beam, and indexing can not be accurately performed. As shown in FIGS. 26b and 26c, even when a pattern consists of only a single protrusion 502 or a single groove 504 in the surface of a substrate 501, the peak 503a or the valley 503b in the surface of the film 503 is still asymmetric and the thickness of the film 503 is different on the left and right sides of the protrusion 502 or groove 504. As a result, dimensional accuracy is decreased. A similar problem occurs when manufacturing on-chip filters for color image sensors by spin coating.

When a film is formed on a substrate by a spin coating method in which the substrate is rotated in a horizontal plane, the only force acting normal to the surface of the substrate is the force of gravity, which is not large enough to remove surface irregularities. Therefore, in order to form a smooth film on a substrate with an irregular surface using a conventional spin coating method, it is necessary either to increase the thickness of the film or to form a plurality of films, as in the multilayer resist method. However, both of these methods are inefficient ways to form a smooth film.

SUMMARY OF THE INVENTION

It is therefore an object of the present invention to provide a spin coating method which forms a smooth and uniform film on a substrate having an irregular surface.

It is another object of the present invention to provide a spin coating apparatus for carrying out this method.

It is still another object of the present invention to provide a spin coating apparatus which suppresses the formation of dust and prevents dust from contacting a substrate which is being coated.

In a spin coating method according to the present invention, a substrate is first rotated in its own plane about a first axis to spread a coating material over the surface of the substrate. The substrate is then revolved about a second axis while the surface of the substrate is tilted towards the second axis. The angle of tilt of the substrate is preferably chosen such that the vectorial sum of gravity and centrifugal force acting on the coating material is perpendicular to the surface of the substrate. The sum of gravity and centrifugal force is much larger than the force of gravity alone, and as it is perpendicular to the surface of the substrate, removes undulations in the surface of the coating material and creates a smooth, level coating of uniform thickness.

A spin coating method in accordance with the present invention comprises the steps of applying a coating material to the surface of a substrate, spinning the substrate in its own plane about a first axis to spread the coating material over the surface of the substrate, and then revolving the substrate about a second axis while tilting the coated surface of the substrate towards the second axis.

During the step of rotating the substrate in its plane about the first axis, it is possible to simultaneously revolve the substrate about the second axis.

During the steps of rotating the substrate about the first axis and revolving it about the second axis, the substrate may be surrounded by an atmosphere containing a solvent vapor. The atmosphere can be created by supplying a solvent to the inside of a cup which houses the substrate during spin coating and allowing the solvent to evaporate. The solvent vapor in the atmosphere suppresses the vaporization of the solvent in the coating material and prevents the coating material from drying before it has been smoothened.

A spin coating apparatus for carrying out the method of the present invention comprises means for rotating a substrate in its own plane about a first axis, means for revolving the substrate about a second axis, and means for tilting the surface of the substrate towards the second axis while it is being revolved.

BRIEF DESCRIPTION OF THE DRAWINGS

FIG. 4 is a flow chart of a first embodiment of a spin coating method according to the present invention.

FIGS. 6a, 6b and 6c are cross-sectional views of the surfaces of three different substrates which have been coated by the method of the present invention.

FIG. 8 is a flow chart of a second embodiment of a spin coating method according to the present invention which is performed by the embodiment of FIG. 7.

FIG. 9a shows the timing of the various stages of the method of FIG. 8, FIG. 9b shows the timing for the introduction of solvent, and FIGS. 9c, 9d and 9e show the chuck tilt angle, the speed of revolution of the chuck, and the rotational speed of the chuck, respectively, as a function of time.

FIG. 19 is a vertical cross-sectional view of the cup of the embodiment of FIG. 18.

FIG. 20 is an enlarged cross-sectional view of a portion of the walls of the cup of FIG. 19.

FIGS. 24a, 24b, 22c, 22d, 22e, 22f, 22g and 24h are cross-sectional views of a silicon substrate at different stages during the formation of a color filter.

DESCRIPTION OF THE PREFERRED EMBODIMENTS

Figure 1:
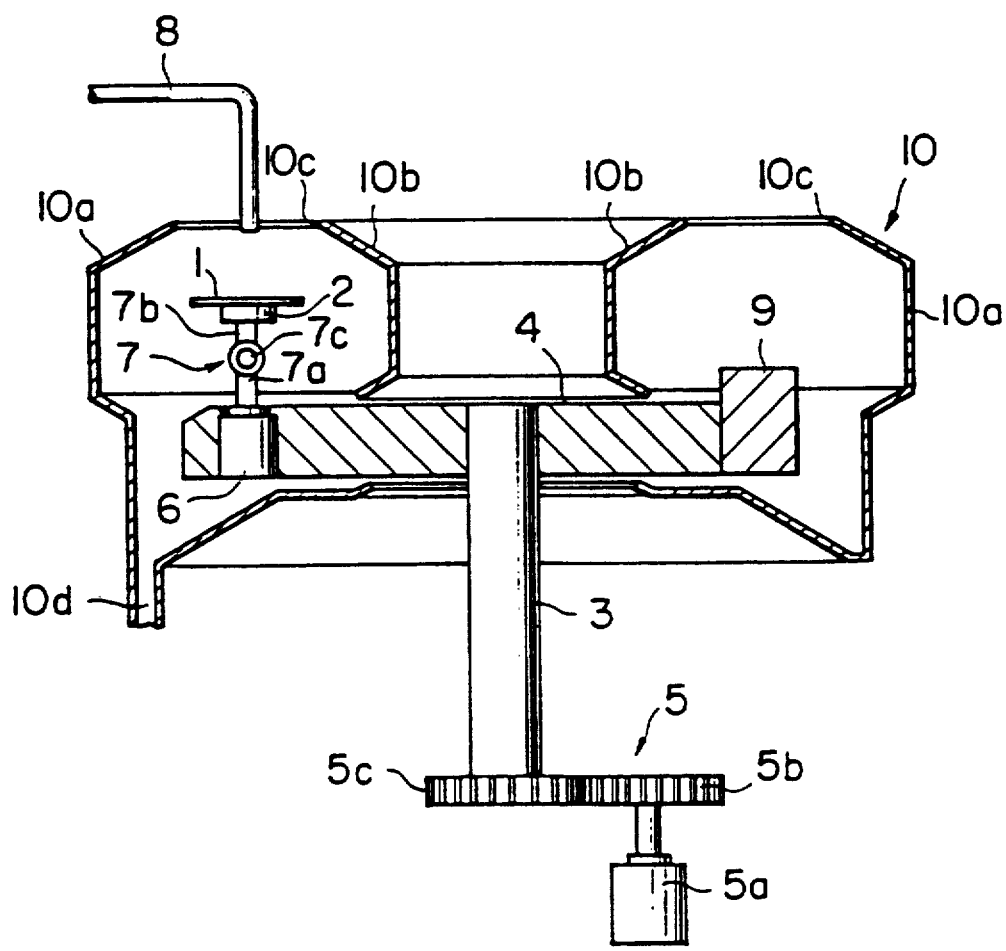
FIG. 1 is a vertical cross-sectional view of a first embodiment of a spin coating apparatus according to the present invention.
Figure 2:
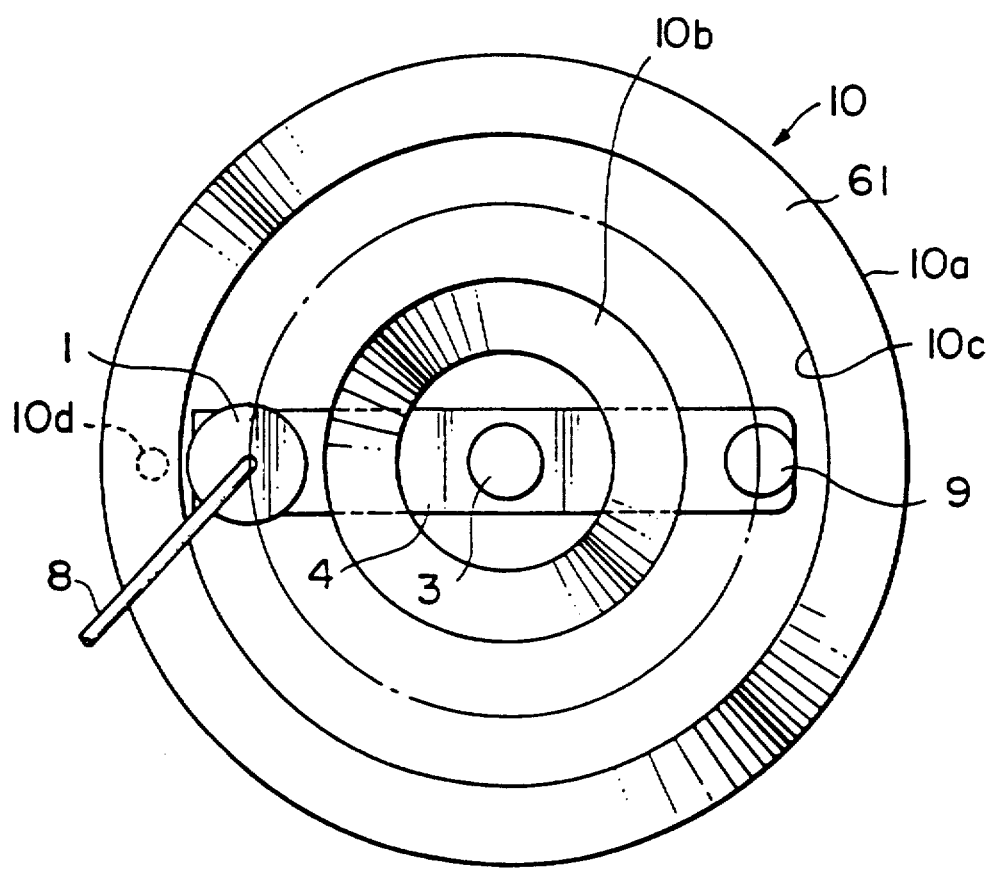
FIG. 2 is a plan view of the embodiment of FIG. 1.
Figure 3A:
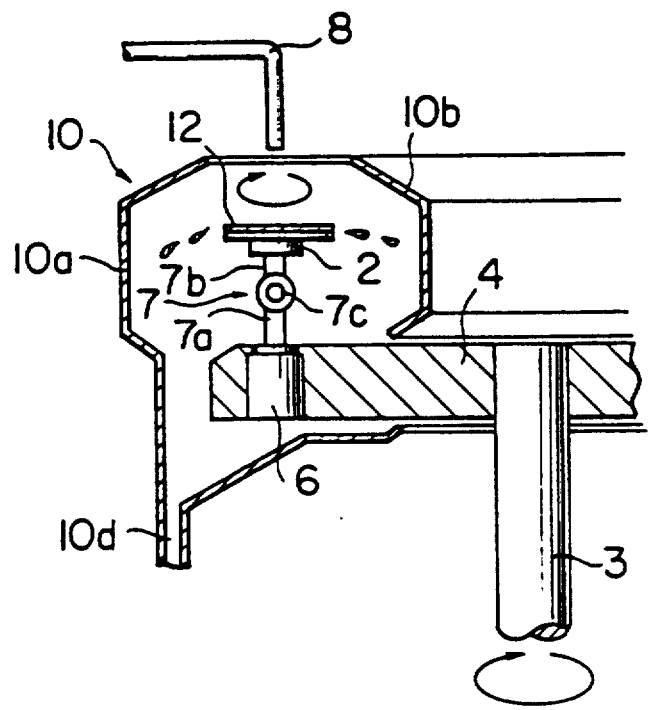
FIGS. 3a and 3b are vertical cross-sectional views of the left half of the embodiment of FIG. 1 during two different stages of operation.
Figure 3B:
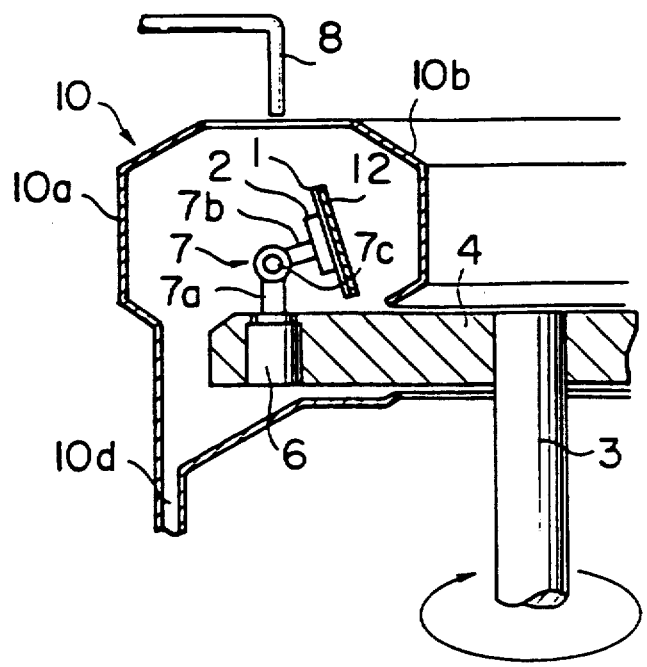
Figure 5A:
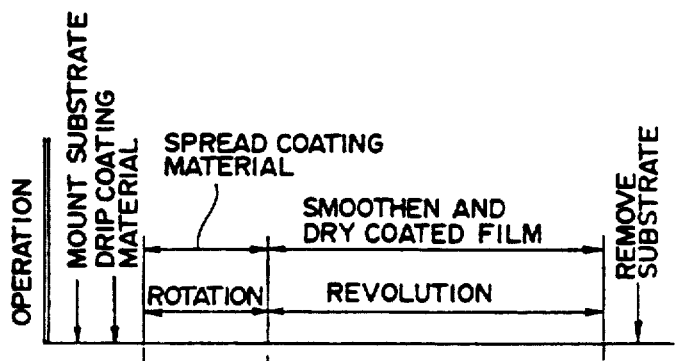
FIG. 5a shows the timing of the various stages of the method of FIG. 4 and FIGS. 5b, 5c, and 5d show the chuck tilt angle, the speed of revolution of the chuck, and the rotational speed of the chuck, respectively, as a function of time.
Figure 5B:
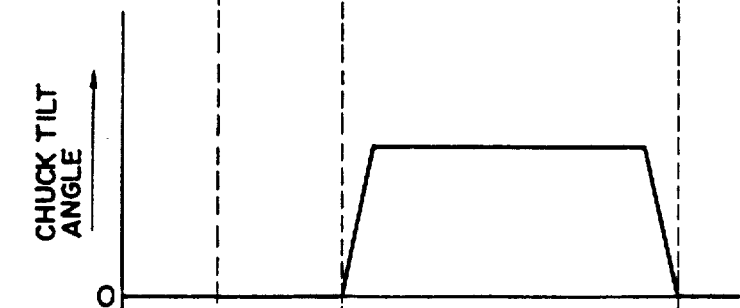
Figure 5C:
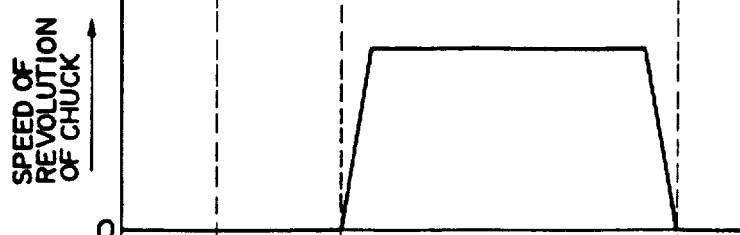
Figure 5D:
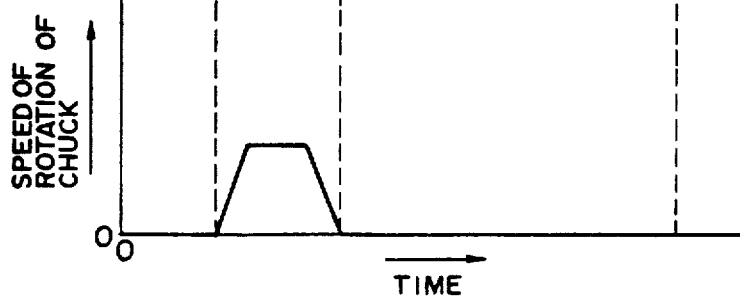

A number of preferred embodiments of a spin coating method and a spin coating apparatus according to the present invention will now be described while referring to the accompanying drawings. FIGS. 1–3 illustrate a first embodiment of a spin coating apparatus. FIG. 1 is a vertical cross-sectional view of the embodiment, FIG. 2 is a plan view thereof, and FIGS. 3a and 3b are vertical cross-sectional views of portions of the embodiment of FIG. 1 during different operating states. As shown in FIGS. 1 and 2, this embodiment of a spin coating apparatus is equipped with a vacuum chuck 2 on which a substrate 1 such as a semiconductor wafer is mounted. The chuck 2 has a horizontal support surface to which the substrate 1 is securely held by suction. The chuck 2 is connected to the rotating output shaft of an electric motor 6 by a tilting mechanism 7 which transmits the rotation of the motor 6 to the chuck 2 and which can tilt the support surface of the chuck 2 with respect to the horizontal. The tilting mechanism 7 includes a lower spindle 7a which is secured to the output shaft of the motor 6, an upper spindle 7b which is secured to the chuck 2 at its center of rotation, and a connecting member such as pivot pin 7c which pivotally connects the upper and lower spindles 7a and 7b with one another. The tilting mechanism 7 also includes an unillustrated drive mechanism which can pivot the upper spindle 7b about the pivot pin 7c. An example of a suitable drive mechanism is a hydraulic drive mechanism such as the one which is employed in the embodiment of FIG. 10, which will be described further on.

The electric motor 6 is embedded in one end of a bar-shaped horizontal support arm 4. A balance weight 9 is secured to the other end of the support arm 4 to give it dynamic balance. At its center of balance, the support arm 4 is secured to the top of a vertical rotating shaft 3 which is rotatably supported on an unillustrated housing or other stationary member by unillustrated bearings. The rotating shaft 3 can be rotated on its axis by an electric motor 5a via a first pinion 5b which is secured to the output shaft of the motor 5a and a second pinion which is secured to the lower end of the rotating shaft 3 and meshes with the first pinion 5b. The motor 5a is mounted on an unillustrated stationary member such as a housing.

The support arm 4 and all the members mounted on it are covered by an annular cup 10. The cup 10 includes an outer half 10a and an inner half 10b which is concentric with respect to the outer half 10a. An annular opening 10c is formed in the top surface of the cup 10 between the rims of the outer half 10a and the inner half 10b. A drain 10d through which excess coating material can be discharged is formed in the bottom of the cup 10.

A nozzle 8 for supplying a coating material to the surface of the substrate 1 is disposed above the chuck 2 in the annular opening 10c with its discharge end pointing downwards.

In this embodiment, electric motor 6 comprises means for rotating a substrate 1 in its own plane about a first axis (the axis of the chuck 2). Electric motor 5a comprises means for revolving the substrate about a second axis (the axis of the rotating shaft 3). The tilting mechanism 7 comprises means for tilting the surface of the substrate 1 towards the second axis.

Next, a first embodiment of a spin coating method of the present invention using the spin coating apparatus of FIG. 1 will be described while referring to FIGS. 3 through 5. FIGS. 3a and 3b are cross-sectional views of the left side of the embodiment of FIG. 1 during two different stages of operation, FIG. 4 is a flow chart of a first embodiment of a spin coating method, and FIG. 5 is a timing diagram for the method of FIG. 4. First, while motors 5a and 6 are both turned off, in Step S1 of FIG. 4, a substrate 1 such as a semiconductor wafer is transported into the cup 10 by a mechanical conveyor, for example, and is mounted on the support surface of the chuck 2, which at this time is horizontal. The substrate 1 is held to the support surface of the chunk 2 by suction.

Next, in Step S2, a prescribed amount of a coating material 12 is dripped onto the top of the substrate 1 by the nozzle 8.

In Step S3, electric motor 6 is turned on and the substrate 1 is rotated about the rotational axis of the chuck 2 in a horizontal plane. At this time, the other electric motor 5a may be turned off so that the substrate 1 is only rotated, or it may be turned on at the same time as electric motor 6 so that the substrate 1 is simultaneously rotated about the rotational axis of the chuck 2 and revolution about the axis of shaft 3. The rotation or combined rotation and revolved of the substrate 1 generates a centrifugal force which causes the coating material 12 to spread radially outwards from the center of the substrate 1 and form a this film over the entire surface of the substrate 1. Excess coating material 12 is flung from the substrate 1 by centrifugal force. Upon striking the inner walls of the cup 10, the excess coating material 12 flows downwards and is discharged through the drain 10d.

After the substrate 1 has been rotated for a prescribed length of time, in Step S4, the motors 5a and 6 are both stopped. At this time, the surface of the thin film of the coating material 12 may be wavy or otherwise nonuniform. In order to remove the nonuniformities, the substrate 1 is then revolved while its surface is tilted towards the center of revolution. In Step S5, electric motor 5a is turned on to revolve the substrate 1 around the rotating shaft 3. As the substrate 1 is being revolved, it is tilted by the tilting mechanism 7 towards the axis of the rotating shaft 3. As shown in the timing diagram of FIG. 5, the tilting and revolution of the substrate 1 preferably begin simultaneously, and the angle of tilt is adjusted in accordance with the speed of revolution so that the vector sum of gravity and centrifugal force acting on the coating material 12 will be substantially perpendicular to the surface of the substrate 1. The combination of gravity and centrifugal force removes the waviness in the surface of the thin film of coating material 12 by forcing the material forming the peaks in the film to flow into the valleys, and a smooth film of uniform thickness is produced. As the revolution of the substrate 1 continues, the solvent in the coating material vaporizes and the thin film dries.

After the thin film has dried, in Step S6, electric motor 5a is turned off and the revolution of the substrate 1 is stopped. As the speed of revolution decreases, the tilting mechanism 7 returns the substrate 1 to a horizontal position.

The chuck 2 then releases the substrate 1, and in Step S7, the substrate 1 is removed from the chuck 2 and transported to the outside of the cup 10 by the unillustrated conveyor.

Each time the steps illustrated in FIG. 4 are performed, a single substrate 1 can be spin coated. By repeating these same steps again and again, a large number of substrates can be coated in succession.

FIGS. 6a through 6c are schematic cross sections of thin films formed on various substrates 1 by the method of FIG. 4. Despite the presence of grooves and protrusions in the surface of a substrate 1, the thin film of a coating material 12 which was formed on the substrate is smooth and nearly completely flat.

In the method of FIG. 4, the coating material 12 is dripped onto a substrate 1 while the substrate 1 is stationary. However, it is also possible to apply the coating material 12 to the substrate 1 while the substrate 1 is being rotated.

Figure 7:
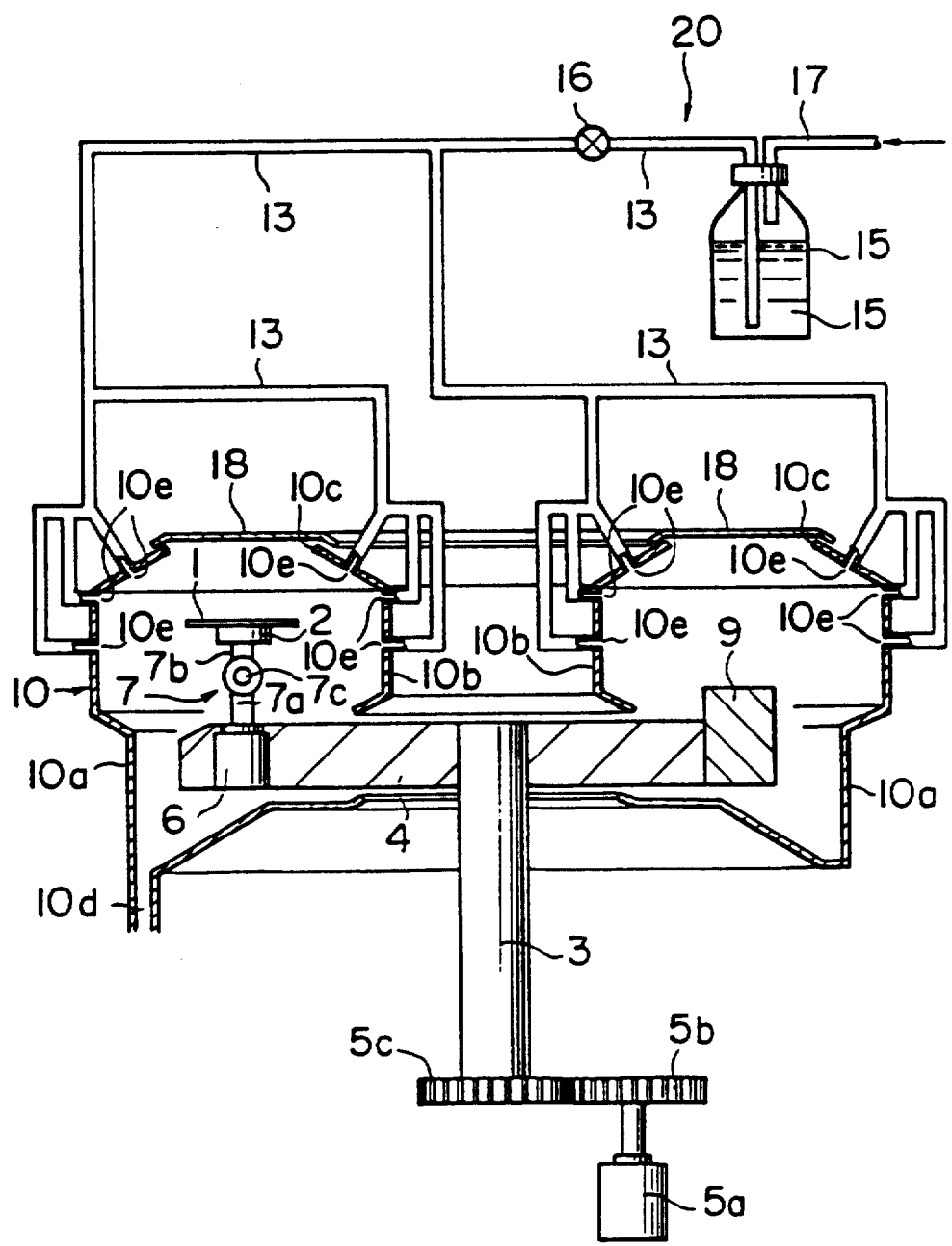
FIG. 7 is a vertical cross-sectional view of a second embodiment of a spin coating apparatus according to the present invention.

FIG. 7 illustrates a second embodiment of a spin coating apparatus according to this invention. This embodiment differs from the embodiment of FIG. 1 in that it further includes a solvent supply mechanism for supplying a solvent ot the inside of a cup 10. As shown in FIG. 7, a plurality of inlets 10e for introducing a solvent are formed in the upper portion of a cup 10. The inlets 10e are connected by piping 13 to a sealed vessel 15 which contains a solvent 14. This solvent 14 is the same as the solvent contained in the coating material which is applied to the substrate 1. A volve 16 for regulating the flow of solvent 14 is connected to the piping 13. The sealed vessel 15 is connected by piping 17 to an unillustrated source of a pressurized gas such as pressurized air or nitrogen. The space inside the vessel 15 above the surface of the solvent 14 is maintained at a pressure greater than atmospheric pressure by the pressurized gas. When the valve 16 is opened, the solvent 14 within the sealed vessel 15 is forced through the piping 13 by the pressurized gas and is supplied to the inside of the cup 10 through the inlets 10e. The flow rate of solvent 14 through the inlets 10e can be controlled by adjusting the pressure of the pressurized gas or by adjusting the degree of opening of the valve 16. An annular opening 10c in the top of the cup 10 is covered by a removable lid 18 which can be opened and closed as necessary. An unillustrated nozzle is also provided for redripping a coating material onto the substrate 1. The structure of this embodiment is otherwise the same as that of the embodiment of FIG. 1.

Spin coating is performed using this embodiment in basically the same manner as for the embodiment of FIG. 1. During spin coating, the inside of the sealed vessel 14 is maintained at a suitable pressure by the pressurized gas. When the valve 16 is opened, solvent 14 is introduced into the cup 10 via the inlets 10e, flows along the inner walls of the cup 10 and then falls downwards. As the solvent 14 falls, it vaporizes and forms an atmosphere of solvent vapor within the cup 10. The concentration of the solvent vapor in the cup 10 is determined by the relationship between the rate of discharge of solvent vapor from the drain 10d, the rate of escape of solvent vapor from openings in the cup 10, and by the rate of inflow of the solvent 14. If the annular opening 10c in the top of the cup 10 is covered with the lid 18, the escape of solvent vapor from the opening 10c can be suppressed, and the required inflow rate of solvent for maintaining a desired vapor concentration can be reduced.

A spin coating method using the apparatus of FIG. 7 will be described in greater detail while referring to the flow chart of FIG. 8 and the timing diagram of FIG. 9. First, as in the method of FIG. 4, the tilting mechanism 7 is adjusted so that the substrate support surface of the chuck 2 is horizontal, in Step S101 the lid 18 is opened and a substrate 1 is transported into the cup 10 and mounted on the chuck 2, where it is held in place by suction. In Step S102, a prescribed amount of a coating material is dripped onto the substrate 1 from a nozzle through the opening 10c in the top of the cup 10, and then the lid 18 is closed. In Step S103, one or both of the motors 5a and 6 is turned on, and the substrate 1 is rotated on its axis or both rotated and revolved at the same time.

Figure 16:
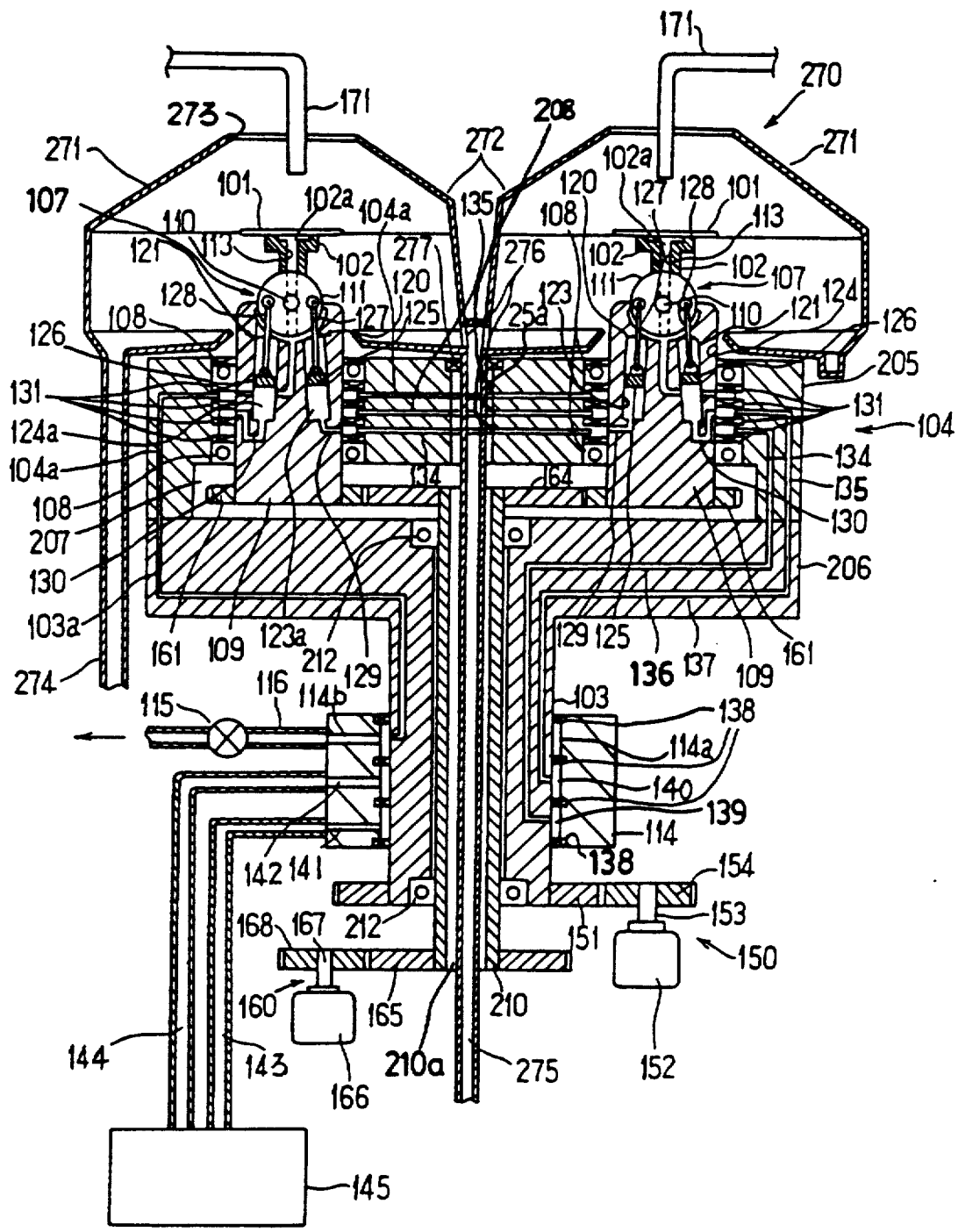
FIG. 16 is a vertical cross-sectional view of a sixth embodiment of a spin coating apparatus according to the present invention.
Figure 17:
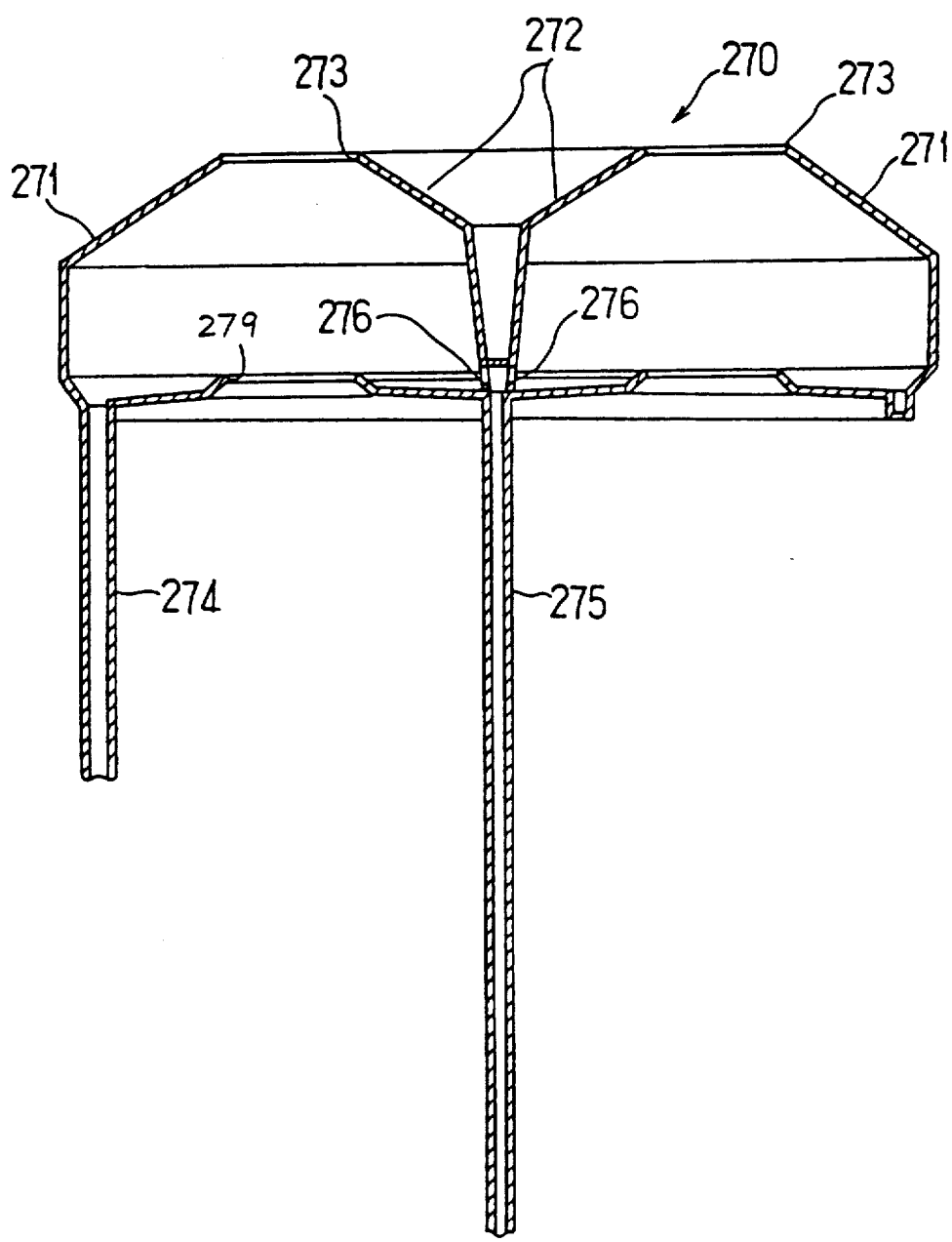
FIG. 17 is a vertical cross-sectional view of the cup of the embodiment of FIG. 16.

If the solvent in the coating material is extremely volatile, while the substrate 1 is still being rotated, the solvent in the coating material may completely vaporize and the film may dry, resulting in wavy irregularities like those shown in FIGS. 16 and 17 being formed in the surface of the thin film. In this case, as the surface is already dry, it can not be flattened, even if the substrate is then revolved while being tilted. The same result occurs if the solvent should completely vaporize early in the step in which the substrate 1 is being revolved.

It is therefore important to prevent the solvent in the coating material from completely vaporizing before the coated film has been flattened by revolving. Accordingly, in the method of FIG. 8, a solvent is introduced into the atmosphere inside the cup 10 surrounding the substrate 1 to slow the vaporization of the solvent in the coating material. In Step S104, simultaneously with or after the start of rotation of the substrate 1, valve 16 is opened and solvent is introduced into the cup 10 via the inlets 10e. The solvent 14 vaporizes to form a solvent vapor atmosphere inside the cup 10. If the partial pressure of the solvent vapor within the cup 10 is increased to the saturated vapor pressure of the solvent in the coating material, the solvent in the coating material can be completely prevented from vaporizing and the film can be maintained in a fluid state. In this manner, the coating material is prevented from drying and hardening during the rotation of the substrate 1. When the coating material has spread over the entire surface of the substrate 1, in Step S105, the rotation of the substrate 1 is stopped. In Step S106, the substrate 1 is revolved about the rotating shaft 3 and is tilted towards the center of the shaft 3. The angle of tilt of the substrate 1 is varied as shown in FIG. 9 in accordance with the speed of revolution so that the direction of the vector sum of centrifugal force and gravity is nearly perpendicular to the surface of the substrate 1. Next, in Step S107, after the surface of the film on the substrate 1 has been made adequately smooth and flat, the valve 16 is closed and the supply of solvent to the inside of the cup 10 is stopped. The substrate 1 continues to be revolved in order to dry and harden the film. The speed of revolution necessary to dry the film is less than that required to flatten its surface, so at this time, it is possible to lower the speed of revolution and the angle of tilt, as shown in FIG. 9. After the film on the substrate 1 has dried, in Step S108 the revolution of the substrate 1 is stopped and the substrate 1 is returned to a horizontal state. The lid 18 of the cup 10 is then opened, and in Step S109, the substrate 1 is removed from the chuck 2 and transported to the outside of the cup 10.

In accordance with the method of FIG. 8, even when using a coating material having a solvent with high rate of vaporization, the vaporization of the solvent in the coating material can be suppressed and a film having a smooth, flat surface can be obtained.

In the embodiments of FIGS. 1 through 9, there is only a single chuck 2, so only a single substrate 1 can be coated at a time. However, if the balance weight 9 is replaced by an electric motor 6, a tilting mechanism 7, and a chuck 2 like those mounted on the opposite end of the support arm 4, two substrates 1 can be coated at the same time. If the number of support arms 4 mounted on the rotating shaft 3 is increased, then a still larger number of substrates 1 can be coated simultaneously. In this case, the number of nozzles 8 can be increased in accordance with the number of substrates 1 to be coated at one time, each nozzle 8 being disposed in a position corresponding to one of the chucks 2. If the sequence of steps illustrated in FIG. 4 or FIG. 8 is carried out simultaneously for each substrate 1, the efficiency of the method of the present invention can be greatly increased.

In the embodiment of FIG. 7, the solvent 14 which is introduced into the cup 10 is the same as the solvent contained in the coating material. However, as long as the solvent in the coating material can be prevented from vaporizing, there are no restrictions on the type of solvent 14. It is also possible to employ a mixture of different solvents. Alternatively, a plurality of different types of solvents can be individually supplied to the inside of the cup 10 from individual vessels 15 connected to the cup 10 by separate piping, valves, and inlets for each vessel 15. The rate of supply of the solvent can be controlled more precisely by connecting a flow rate controller or a pressure regulator to the piping 13, or by employing a plurality of valves 16.

Figure 10:
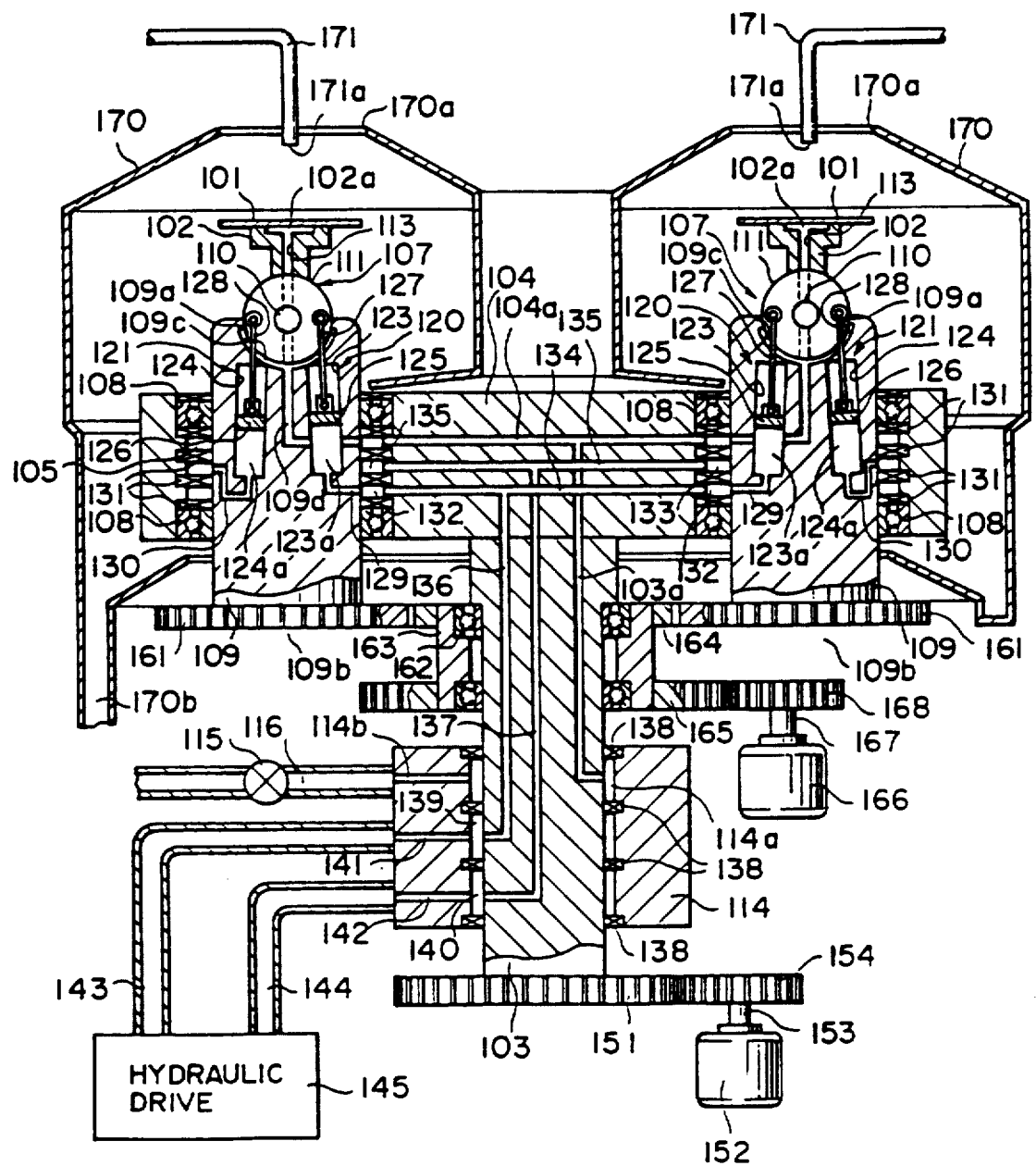
FIG. 10 is a vertical cross-sectional view of a third embodiment of a spin coating apparatus according to the present invention.
Figure 11A:
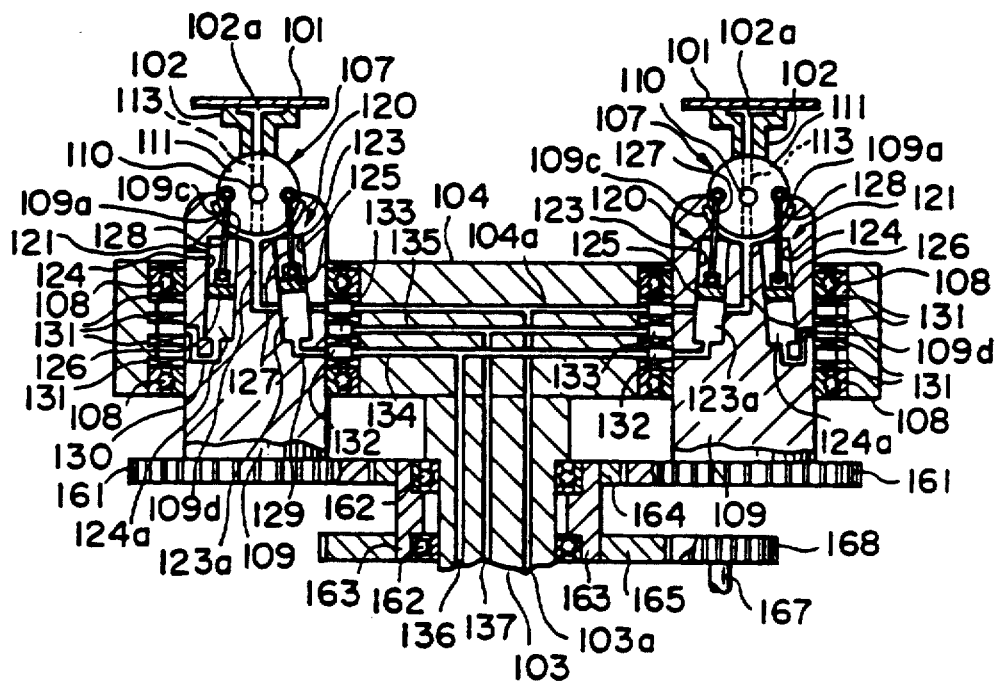
FIGS. 11a and 11b are cross-sectional views of the support arm and chucks of the embodiment of FIG. 10 during different stages of operation.
Figure 11B:
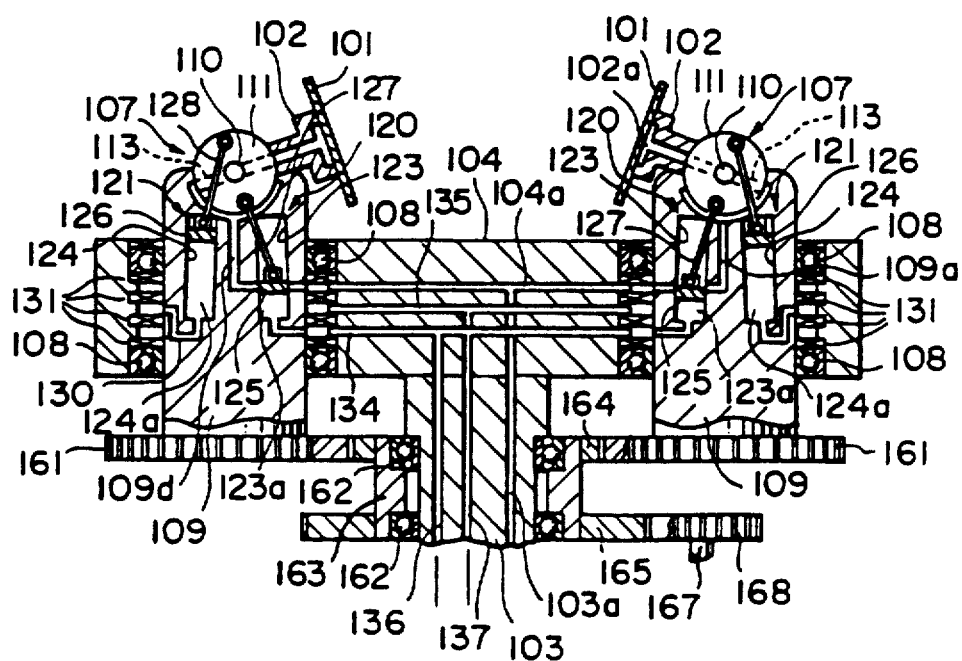

FIG. 10 is a schematic vertical cross-sectional view of a third embodiment of a spin coating apparatus according to this invention, and FIGS. 11a and 11b are cross-sectional views of the central portion of FIG. 10 during two different states of operation. In the embodiments of FIGS. 1 and 7, the electric motor 6 for rotating the substrate 1 is embedded in the support arm 4 in the vicinity of the chuck 2. Due to the small distance between the motor 6 and the chuck 2, dust or other contamination which is generated by the motor 6 can easily reach the surface of the substrate 1 and adhere to it, producing flaws in the film which is formed on the substrate 1. If the support arm 4 has more than one motor 6 mounted on it, the possibility of the substrates 1 being contaminated by dust from the motors 6 is all the higher. In order to decrease the possibility of contamination as much as possible, in this third embodiment, the motor which rotates the substrates is disposed well below the substrates.

As shown in FIG. 10, a support arm 104 is secured at its center to the upper end of a rotating shaft 103. The shaft 103 is rotatably supported by unillustrated bearings which are secured to an unillustrated support member such as a housing. The support arm 104 has two vertical through holes formed near its opposite ends. Two spindles 109 are disposed in these through holes symmetrically with respect to the rotating shaft 103 and are rotatably supported by bearings 108 which are mounted inside the through holes.

The space between the inner surface of each through hole and the outer surface of the corresponding spindle 109 is divided into three annular passageways 105, 132, and 133 by a plurality of annular seals 131 which are spaced apart from one another along the length of the through hole. Three horizontal passageways 104a, 134, and 135 are formed in the support arm 104 between the two through holes. Horizontal passageway 104a extends between the two annular passageways 105, horizontal passageway 134 extends between the two annular passageways 132, and horizontal passageway 135 extends between the two annular passageways 133 at opposite ends of the support arm 104. Horizontal passageways 104a, 134, and 135 are respectively connected to vertical passageways 103a, 136, and 137 which extend vertically through the rotating shaft 103. The lower ends of these vertical passageways open onto the outer surface of the rotating shaft 103.

A stationary annular coupling 114 is loosely mounted on the lower end of the rotating shaft 103 so that the rotating shaft 103 can rotate inside the coupling 114. The space between the inner surface of the coupling 114 and the outer surface of the rotating shaft 103 is divided into three annular passageways 114a, 139, and 140 by a plurality of annular seals 138. Three radial passageways 114b, 141, and 142 extend through the coupling 114 between annular passageways 114a, 139, and 140, respectively, and the outer surface of the coupling 114. The annular passageways 114a, 139, and 140 also communicate with the vertical passageways 103a, 136, and 137, respectively, formed inside the rotating shaft 103.

The two spindles 109 in FIG. 10 have an identical structure, so only the left-hand spindle 109 will be described. The spindle 109 supports a tilting mechanism 107 which a chuck 102 is mounted. The tilting mechanism 107 has a rotating plate 111 which is rotatably mounted on a pivot pin 110 inside a semi-circular depression 109a in the upper end of the spindle 109. The rotating plate 111 can be pivoted in a vertical plane passing through the centerline 109b of the spindle 109. The chuck 102 is secured to the upper end of the rotating plate 111. The chuck 102 has a flat support surface upon which a substrate 101 can be mounted. The substrate 101 is held to the support surface by suction which is exerted on the substrate 101 through a suction port 102a which is formed in the support surface.

A semi-annular passageway 109c is formed in the periphery of the semi-circular depression 109a which houses the rotating plate 111. The suction port 102a communicates with this passageway 109c via an air passageway 113 which extends through the center of the chuck 102 and the rotating plate 111. Passageway 109c is connected to an unillustrated suction device, which generates a negative pressure, through a passageway 109d formed in the spindle 109, annular passageway 105, horizontal passageway 104a, vertical passageway 103a, annular passageway 114a, and radial passageway 114b. The outer end of radial passageway 114b is connected to the suction device via piping 116 equipped with a valve 115. By opening and closing the valve 115, the suction exerted on the substrate 101 by the suction port 102a can be controlled.

This embodiment employs a hydraulic drive mechanism for tilting the chucks 102. The spindle 109 houses a first hydraulic cylinder 120 and a second hydraulic cylinder 121 for pivoting the rotating plate 111 about the pivot pin 110. The first and second hydraulic cylinders 120 and 121 each have a first cylinder bore 123 and a second cylinder bore 124, respectively, which are formed in the spindle 109. The cylinder bores 123 and 124 are symmetrical with respect to the centerline 109b of the spindle 109 and extend roughly in the axial direction of the spindle 109. Pistons 125 and 126 are slidably disposed inside the first and second cylinder bores 123 and 124, respectively. The pistons 125 and 126 are connected to the rotating plate 111 by first and second connecting rods 127 and 128, respectively. The upper end of each connecting rod is pivotably connected to the outer periphery of the rotating plate 111, while the lower end is pivotably connected to one of the pistons. The lower ends of the first and second cylinders 120 and 121 (the portions below the pistons) constitute first and second hydraulic chambers 123a and 124a, respectively. The first and second hydraulic chambers 123a and 124a are connected via oil passageways 129 and 130 formed in the spindle 109 with annular passageways 132 and 133, respectively. Annular passageways 132 and 133 are connected with radial passageways 141 and 142 in coupling 114 via horizontal passageways 134 and 135, vertical passageways 136 and 137, and annular passageways 139 and 140, respectively. The outer ends of radial passageways 141 and 142 are connected with a hydraulic drive apparatus 145 via pipes 143 and 144, respectively. The hydraulic drive apparatus 145, which supplies a hydraulic fluid to the hydraulic cylinders 120 and 121, includes a hydraulic pressure supply, a reservoir, control valves, and other conventional components. By suitably controlling the hydraulic drive apparatus 145, the first and second pistons 125 and 126 are made to reciprocate within the first and second cylinder bores 123 and 124, and the rotating plate 111 is made to pivot about the pivot pin 110 by the first and second connecting rods 127 and 128. The chuck 102 and the substrate 101 can thereby be tilted inwards towards the rotating shaft 103. The supply of working fluid is controlled such that when working fluid is supplied to one of hydraulic chambers 123a and 124a, working fluid is simultaneously discharged from the other of the hydraulic chambers.

The rotating shaft 103 can be rotated on its axis by an electric motor 152. A first drive gear 154 is mounted on the output shaft 153 of the motor 152, and it engages with a first driven gear 151 which is secured to the lower end of the rotating shaft 103 below the annular coupling 114. The first driven gear 151 is illustrated mounted on the very bottom of the rotating shaft 103, but it is possible for the rotating shaft 103 to extend below the first driven gear 151 and for the lower end of the rotating shaft 103 to be supported by a bearing below the first driven gear 151.

Another electric motor 166 is provided for rotating the spindles 109 about their respective axes 109b. Electric motor 166 is secured to an unillustrated stationary housing. A second drive gear 168 is secured to the output shaft 167 of electric motor 166, and it meshes with a second driven gear 165 which is secured to the lower end of a tubular sleeve 163. The sleeve 163 is rotatably mounted on the rotating shaft 103 by means of bearings 162. A third drive gear 164 is secured to the upper end of the sleeve 163, and it meshes with a pair of third driven gears 161 which are secured to the lower ends of the spindles 109. The third drive gear 164 and the third driven gears 161 comprise a planetary gear train. The third drive gear 164 comprise a sun gear and the third driven gears 161 comprise planet gears. In the illustrated example, gears 161 and 164 all have the same number of teeth. When electric motor 166 is operated, the spindles 109 and the chucks 102 which are mounted thereon are rotated on their axes by means of the second driven gear 168, the second driven gear 165, the tubular sleeve 163, the third drive gear 164, and the third driven gears 161.

The chucks 102, the tilting mechanisms 107, the spindles 109, and the support arm 104 are covered by an annular cup 170. An annular opening 170a is formed in the top of the cup 170, and a drain 170b is formed in its bottom. Two nozzles 171 which are connected to an unillustrated supply of a coating material are disposed above the chucks 102. The discharge openings 171a of the nozzles 171 are disposed in the annular opening 170a of the cup 170 and confront approximately the centers of the support surfaces of the chucks 102.

The operation of the embodiment of FIG. 10 is as follows. In order to mount substrates 101 on the chucks 102, the tilting mechanisms 107 are adjusted so that the support surfaces of the chucks 102 are horizontal. Two substrates 101 are then transported into the cup 170 by a mechanical conveyor or the like and are mounted on the support surfaces of the chucks 102. The valve 115 is then opened, and suction is generated at the suction ports 102a by the unillustrated suction device. As a result, the substrates 101 are held securely on the support surfaces by suction. In order to remove the substrates 101 from the chucks 102, the valve 115 is closed, and suction no longer acts on the substrates 101, so the substrates 101 can be easily removed from the chucks 102 and transported to the outside of the cup 170.

When the chucks 102 are to be rotated about their respective axes 109b without revolving, motor 152 is turned off and motor 166 is turned on. The rotation of motor 166 is transmitted to the spindles 109 through the second drive gear 168, the second driven gear 165, the sleeve 163, the third drive gear 164, and the third driven gears 161. The third driven gears 161 have the same number of teeth, so they rotate at the same speed in the same rotational direction. Because motor 152 is turned off, the rotating shaft 103 and the support arm 104 are prevented from rotating.

When the chucks 102 are to be revolved about the rotating shaft 103 without any rotation about the axes 109b of the chucks 102 (so that a prescribed portion of each chuck 102 always faces towards the rotating shaft 103), motors 152 and 166 are both turned on, and their rotational speeds are controlled so that the rotational speeds of the rotating shaft 103 and the spindles 109 will be the same.

When the chucks 102 are to be revolved about the rotating shaft 103 and rotated about the axes 109b of the spindles 109 at the same time, motors 152 and 166 are both turned on, and their rotational speeds are controlled so that the rotational speed of the rotating shaft 103 is different from that of the chucks 102. By suitably controlling the rotational directions and rotational speeds of the motors 152 and 166, the rotational speed and the speed of revolution of the chucks 102 can be adjusted as desired.

Next, the operation of the tilting mechanisms 107 will be described. In this embodiment, the tilting mechanisms 107 are driven by hydraulic force which is generated by the hydraulic drive apparatus 145. The hydraulic force which is generated within the hydraulic drive apparatus 145 is transmitted to the hydraulic chambers 123a and 124a through pipes 143 and 144 and the various oil passageways illustrated in FIG. 10. The oil passageways are normally filled with a working fluid. FIG. 11a shows the substrates 101 maintained horizontal by the chucks 102. Approximately equal amounts of the working fluid are contained with the first and second hydraulic cylinders 120 and 121. In order to tilt the chucks 102 inwards (towards the center of the rotating shaft 103), working fluid is sent from the hydraulic drive apparatus 145 to oil pipe 144, and approximately the same amount of working fluid is discharged from oil pipe 143. As a result, working fluid is supplied to the hydraulic chamber 124a of the second hydraulic cylinder 121, the second piston 126 is moved upwards, and the second connecting rod 128 is extended. At the same time, working fluid is discharged from the hydraulic chamber 123a of the first hydraulic cylinder 120, the first piston 125 is moved downwards, and the first connecting rod 127 is retracted. Therefore, as shown in FIG. 11b, the lefthand rotating plate 111 is rotated in the clockwise direction and the righthand rotating plate 111 is rotated in the counterclockwise direction. In this manner, the chucks 102 and the substrates 101 can both be tilted towards the center of the rotating shaft 103.

In order to return the chucks 102 to their original horizontal positions shown in FIG. 11a, the supply and discharge of working fluid to the first and second hydraulic cylinders 120 and 121 can be carried out in the reverse order from that described above.

The angle of tilt of the chucks 102 is controlled by varying the amount of working fluid which is supplied to one of the first and second hydraulic cylinders 120 and 121 or by varying the amount of working fluid which is discharged from the other hydraulic cylinder.

Using this embodiment, spin coating of a substrate 101 can be performed by the method of FIG. 4. If the embodiment is further equipped with a solvent supply mechanism like that illustrated in FIG. 7, spin coating can also be performed by the method illustrated in FIG. 8.

Figure 12:
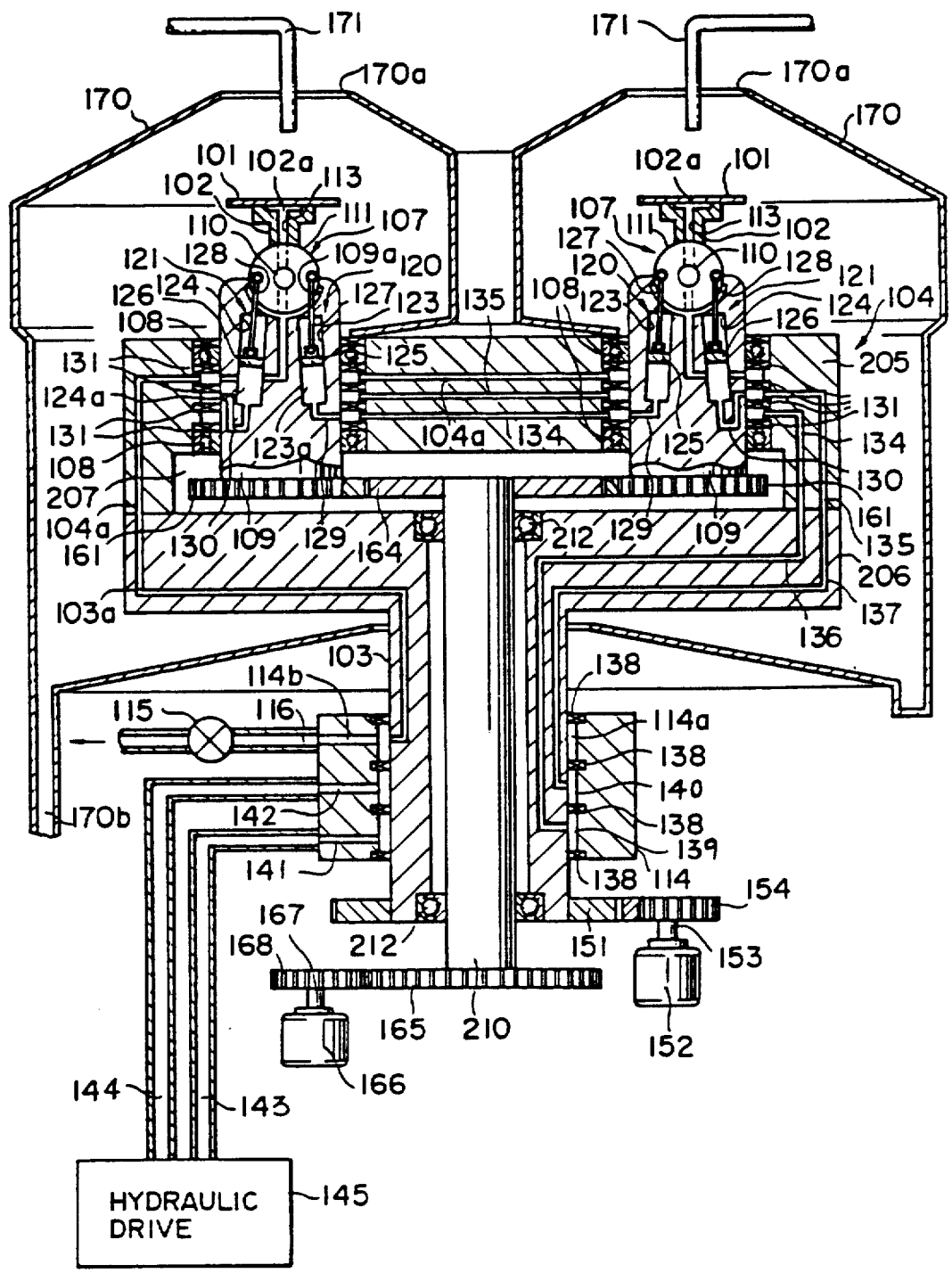
FIG. 12 is a vertical cross-sectional view of a fourth embodiment of a spin coating apparatus according to the present invention.

FIG. 12 illustrates a fourth embodiment of a spin coating apparatus according to this invention. The basic structure and operation of this embodiment are the same as for the embodiment of FIG. 10. This embodiment differs from the embodiment of FIG. 10 in that a planetary gear train for rotating the chucks 102 is housed inside an enclosed space.

As shown in FIG. 12, a support arm 104 is formed from an upper half 205 and a lower half 206. The upper half 205 rotatably supports a pair of spindles 109 and chucks 102 in the same manner as does the support arm 104 of FIG. 10. The lower half 206 of the support arm 104 is integral with the upper end of a hollow rotating shaft 103. A first driven gear 151 is mounted on the lower end of the rotating shaft 103. The first driven gear 151 meshes with a first drive gear 154 which is secured to the rotating shaft 153 of a motor 152 for revolving the chucks 102. When the motor 152 is operated, the rotating shaft 103 is rotated through the first drive gear 154 and the first driven gear 151. The support arm 104 rotates together with the rotating shaft 103, and the chucks 102 are revolved about the rotating shaft 103. As in the embodiment of FIG. 10, air passageways 104a and 103a for generating suction at the suction ports 102a of the chucks 102 and oil passageways 134, 135, 136, and 137 for supplying a working fluid to the first and second hydraulic cylinders 123 and 124 are formed in the upper and lower halves 205 and 206 of the support arm 104 and in the rotating shaft 103.

An enclosed space 207 is formed between the upper and lower halves 205 and 206 of the support arm 104. The lower ends of spindles 109 extend into the enclosed space 207. Third driven gears 161 are secured to the lower ends of these spindles 109.

The third driven gears 161 mesh with radially opposite sides of a third drive gear 164 which is secured to the upper end of a transmission shaft 210 shaft 210 passes through the center of the lower half 206 of the support arm 104 and through the entire length of the hollow rotating shaft 103. The transmission shaft 210 is rotatably supported by bearings 212 which are mounted inside the upper end of the lower half 206 and the lower end of the rotating shaft 103. A second driven gear 165 is secured to the lower end of the transmission shaft 210. It meshes with a second drive gear 168 which is secured to the rotating shaft 167 of a motor 166 for rotating the chucks 102 on their axes. When motor 166 rotates, the transmission shaft 210 is rotated through the second drive gear 168 and the second driven gear 165. The chucks 102 are made to rotate on their axes through the third drive gear 164 and the third driven gears 161. At least one of the transmission shaft 210 and the rotating shaft 103 is rotatably supported by unillustrated bearings mounted on an unillustrated stationary member such as a housing.

The operation of the gear trains and the tilting mechanisms 107 of this embodiment is essentially the same as for the embodiment of FIG. 10, and spin coating of a substrate 101 can be performed in the same manner as with the embodiment of FIG. 10.

In this fourth embodiment, the third drive gear 164 and the third driven gears 161 comprising a planetary gear train are housed inside the enclosed space 207. Therefore, almost none of the contamination such as dust and dirt which is generated by the planetary gear train can leak to the outside of the support arm 104.

Accordingly, no significant contamination from the gear train can reach the substrates 101 and damage the films formed on the substrates 101. Conversely, excess coating material which is flung from on the substrates 101 during spin coating is prevented from adhering to the gears 161 and 164. If coating material should enter between the teeth of the gears, the gears may operate improperly and generate increased quantities of contamination. Therefore, disposing the gears 161 and 164 in the enclosed space 207 not only prevents the spread of dust but also suppresses the generation of dust by preventing coating material from reaching the gears 161 and 164.

Figure 13:
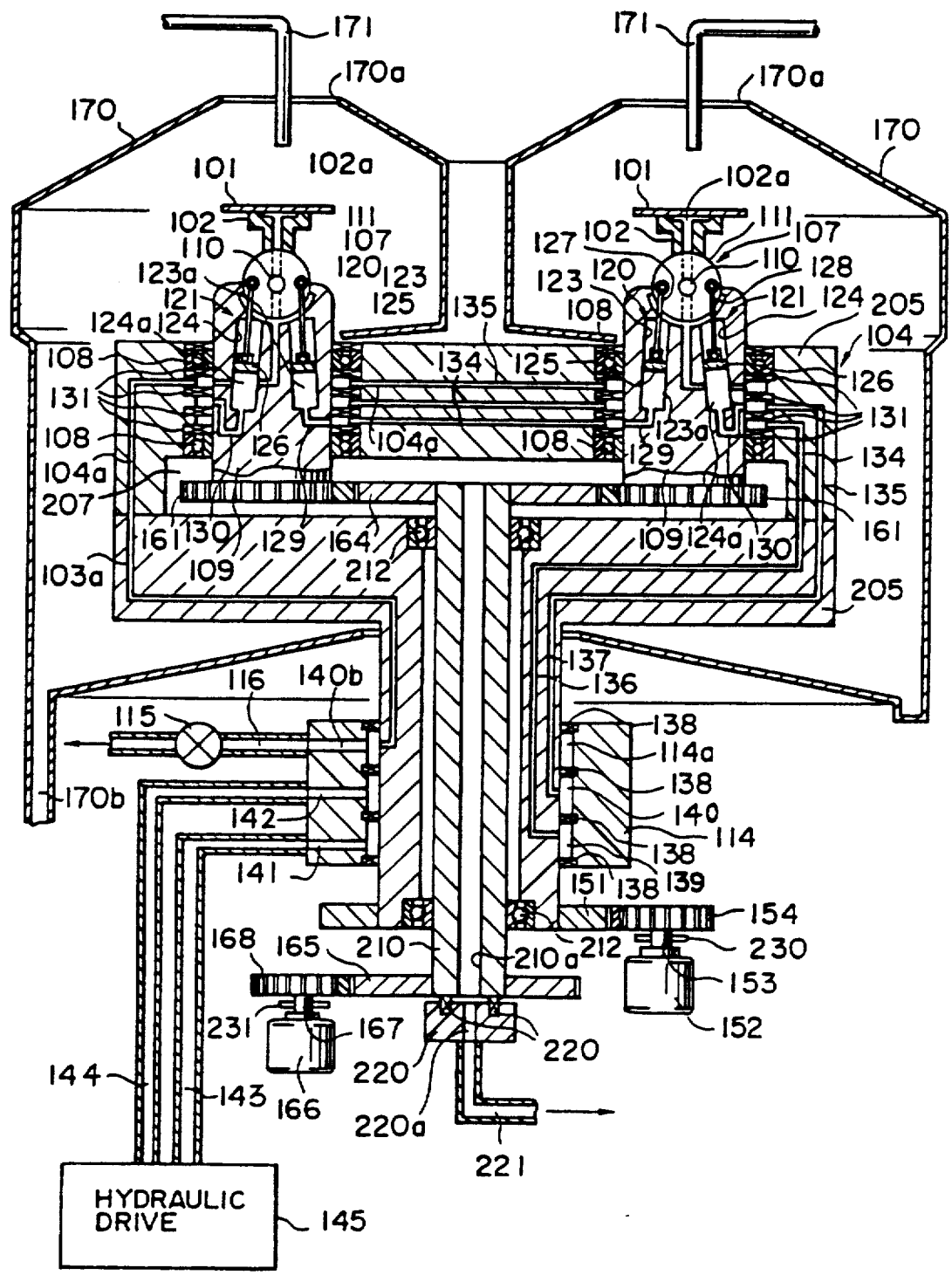
FIG. 13 is a vertical cross-sectional view of a fifth embodiment of a spin coating apparatus according to the present invention.

FIG. 13 illustrates a fifth embodiment of a spin coating apparatus according to the present invention. The basic structure and operation of this embodiment are the same as for the embodiment of FIG. 12. It differs from the embodiment of FIG. 12 in that a through hole 210a extends through the entire length of a rotatably supported transmission shaft 210. The upper end of the through hole 210a opens into an enclosed space 207 which is formed inside a support arm 104 and which houses a third drive gear 164 and third driven gears 161. The lower end of the through hole 210a is connected to an air discharge pipe 221 through a coupling 220 having a discharge passageway 220a formed in it. A gas-tight annular seal 222 is disposed between the coupling 220 and the lower end surface of the transmission shaft 210. This seal 222 connects the coupling 220 and the transmission shaft 210 in an air-tight manner and yet allows them to freely rotate with respect to one another. The air discharge pipe 221 is connected to an unillustrated air discharge apparatus. Gas within the space 207 is sucked into the air discharge apparatus through the through hole 210a in the transmission shaft 210, the air discharge passage 220a within the coupling 220, and the air discharge pipe 221. Accordingly, the space 207 is maintained at a negative pressure with respect to the periphery of the support arm 104. Even if there is a minute gap between the upper and lower halves 205 and 206 of the support arm 104, as the space 207 between the two halves is at a negative pressure, contaminant particles such as dust which are generated by the gears 164 and 161 cannot leak to the outside of the support arm 104 through the gap. The enclosed space 207 is therefore more effective at preventing contamination of the substrates 101.

Rotation detectors 230 and 231 such as rotary encoders are mounted on the output shafts 153 and 167 of electric motors 152 and 166, respectively. The rotation detectors sense the rotational speed and the rotational angle of the output shafts of the motors and generate corresponding output signals which are provided to an unillustrated control circuit. The rotational angles of the chucks 102, their rotational speeds, their angles of revolution, and their speeds of revolution can be calculated based on the number of teeth of each gear of the planetary gear train and other gears 154, 151, 168 and 165 as well as the rotational angles and rotational speeds of the motors 152 and 166. In almost all cases, the number of gear teeth remains constant for a given gear, so if the rotational angles and rotational speeds of the motors 152 and 166 are monitored, the state of rotation and revolution of the chucks 102 can be calculated.

Figure 14:
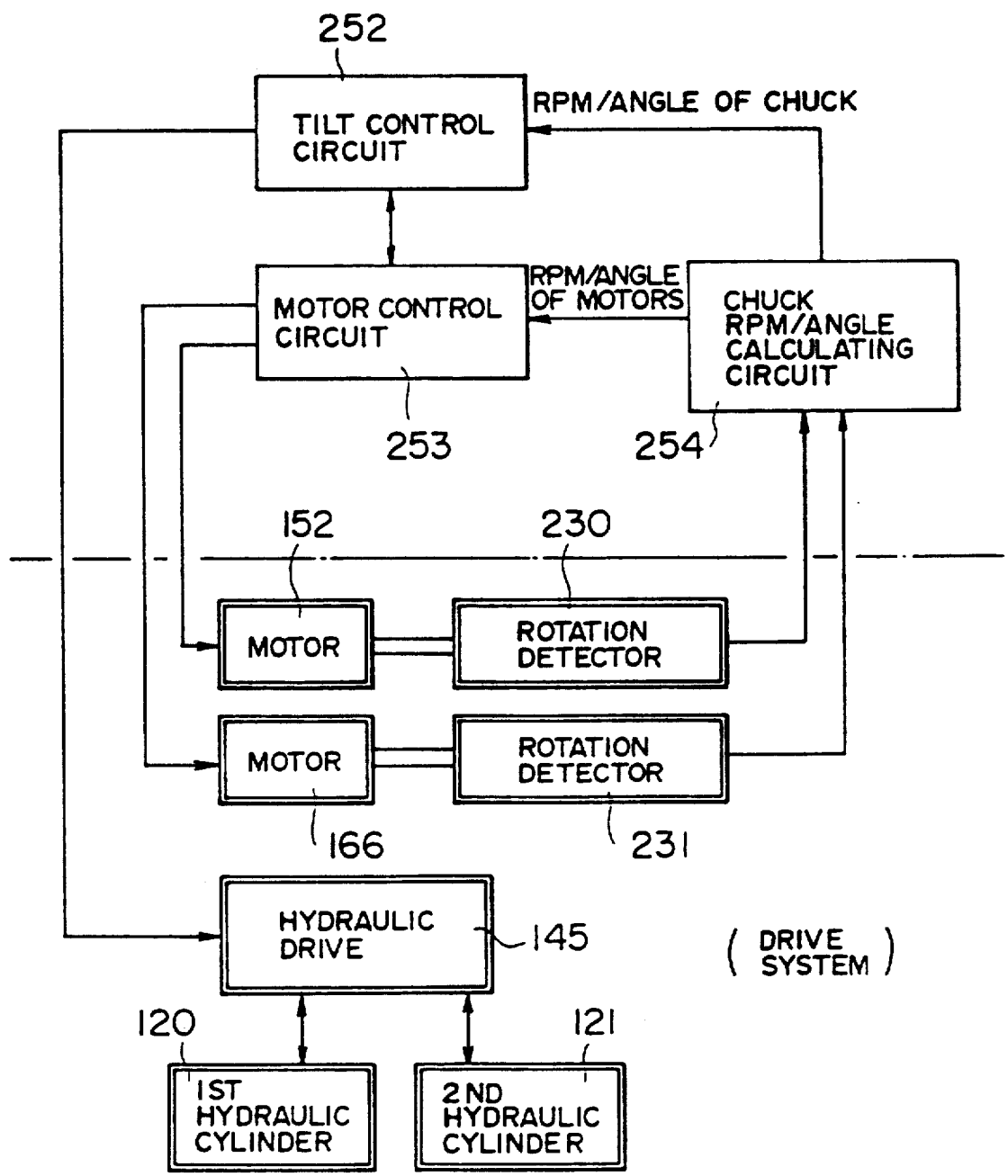
FIG. 14 is a block diagram of the embodiment of FIG. 13 and a control system for controlling its operation.

FIG. 14 is a block diagram of the embodiment of FIG. 13 and a controller for controlling its operation. The upper half of the drawing shows a control system, and the lower half shows a drive system. The control system comprises a tilting mechanism control circuit 252, a motor control circuit 253, and a chuck rotational angle and speed calculating circuit 254. The drive system comprises the motors 152 and 166, the rotation detectors 230 and 231, the hydraulic drive apparatus 145, and the first and second hydraulic cylinders 120 and 121.

The motors 152 and 166 are driven in response to control signals from the motor control circuit 253, and the rotational states of the motors 152 and 166 are monitored by the rotation detectors 230 and 231. The output signals from the rotation detectors 230 and 231 are sent to the chuck rotational angle and speed calculating circuit 254. In this circuit 254, based on the rotational angle and rotational speed signals for motors 152 and 166 and the number of teeth in each of the gears in the planetary gear train and other gears 154, 151, 168 and 165, the rotational angle and speed and the angle and speed of revolution of the chucks 102 are calculated. The results of the calculations are sent to the tilting mechanism control circuit 252, and information concerning the motors 152 and 166 is sent to the motor control circuit 253.

Based on the information on the states of rotation and revolution of the chucks 102 obtained from the chuck rotational angle and speed calculating circuit 254, the tilting mechanism control circuit 252 provides control signals as necessary to the hydraulic drive apparatus 145. In accordance with the control signals, the hydraulic drive apparatus 145 adjusts the amount of working fluid which is sent to the first and second hydraulic cylinders 120 and 121, and the tilting mechanism 107 is operated. In the motor control circuit 253, based on signals from the chuck rotational angle and speed calculating circuit 254 and control signals from the tilting mechanism control circuit 252, control signals which control the operating states of the motors are sent to the motors 152 and 166. In this manner, there is closed loop control of the motors 152 and 166 and open loop control of the tilting mechanisms 107.

Next, a third embodiment of a spin coating method of the present invention using a spin coating apparatus equipped with rotation detectors 230 and 231 will be described while referring to FIG. 15, which is a flow chart of this method.

The tilting mechanisms 107 illustrated in FIGS. 10, 12, and 13 are capable of tilting the chucks 102 in any direction, the direction being determined by the angles of rotation of the spindles 109. However, in accordance with the coating method of the present invention, the chucks 102 should be tilted towards the center of revolution, i.e., towards the center of the rotating shaft 103. Therefore, when the tilting mechanisms 107 are operated to tilt the chucks 102, it is important that the rotational angles of the spindles 109 be such that both of the rotating plates 111 of the tilting mechanism 107 lie in the same vertical plane passing through the center of the rotating shaft 103. This is the state illustrated in FIG. 13. If the rotating plates 111 do not lie in the same vertical plane, when the tilting mechanisms 107 are operated, the chucks 102 will not be tilted towards the rotating shaft 103. FIG. 15 illustrates a control method for ensuring that the rotating plates 111 are properly aligned when the substrates 101 are tilted.

Figure 15:
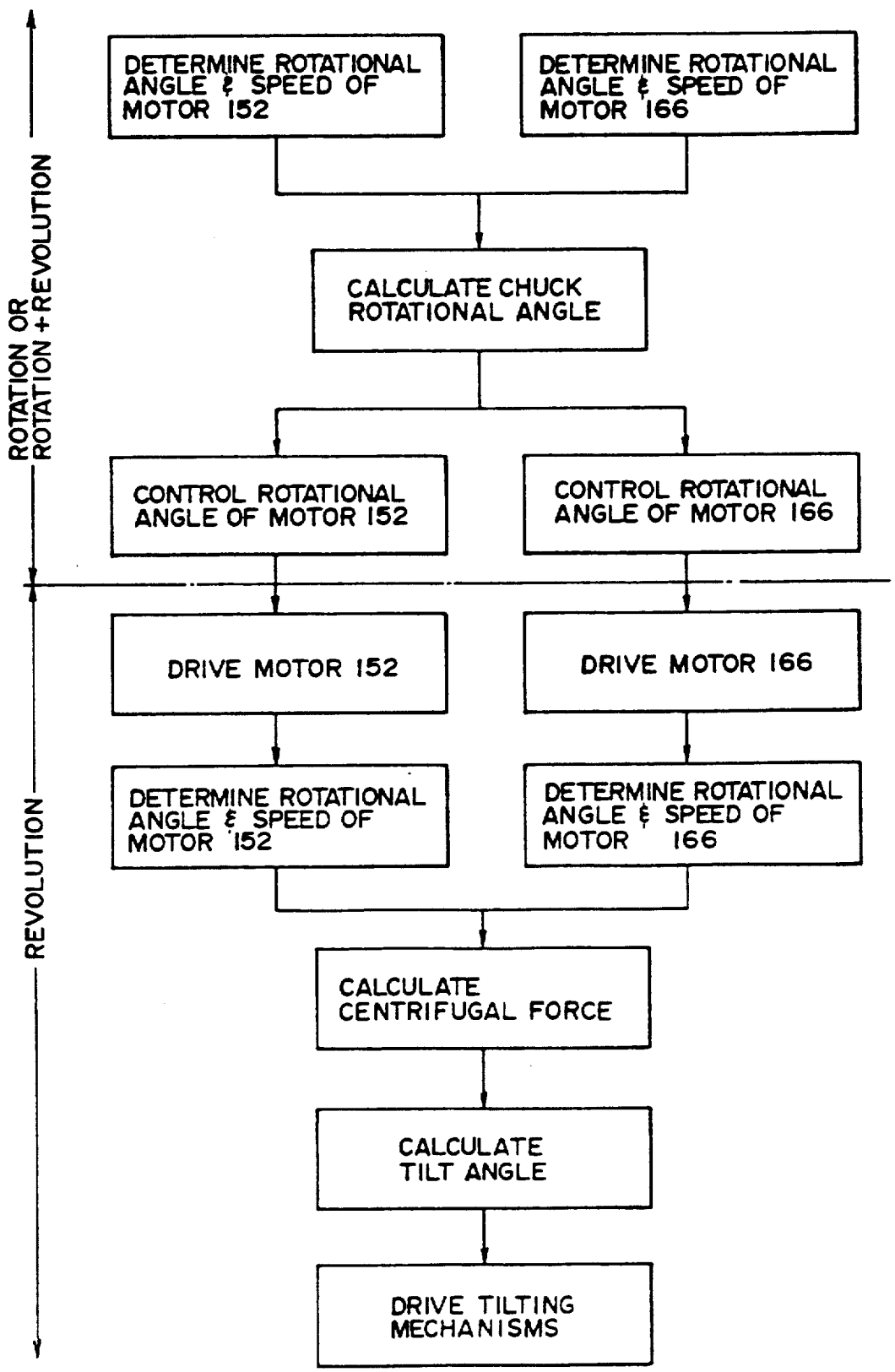
FIG. 15 is a flow chart of a method of controlling the motors and tilting mechanisms of the embodiment of FIG. 13.

As shown in FIG. 15, when the substrates 101 are being rotated in a horizontal plane, the rotational angles of the chucks 102 are calculated based on the signals from the rotation detectors 230 and 231 which indicate the rotational angles and speeds of the motors 152 and 166. When the rotation of the substrates 101 in a horizontal plane is to be stopped, the rotational angles of the motors 152 and 166 are controlled so that when the spindles 109 stop, the rotating plates 111 will lie in the same vertical plane. The chucks 102 are then tilted towards the rotating shaft 103. The motors 152 and 166 are then driven to revolve the chucks 102 about the rotating shaft 103. At this time, the rotational angles and speeds of the motors 152 and 166 are monitored and the speed of revolution of the chucks 102 is calculated. The tilting mechanisms 107 are simultaneously operated to adjust the angle of tilt of the chucks 102 so that the vector sum of centrifugal force and gravity will be perpendicular to the surfaces of the substrates 101. The angle of tilt of the chucks 102 is adjusted in accordance with changes in the speed of revolution of the chucks 102, as shown in FIGS. 6 or 9.

The embodiments of FIGS. 10-13 are equipped with only a single pair of chucks 102. However, any number of chucks 102 may be employed, and the greater the number of chucks 102, the greater is the efficiency with which spin coating can be performed.

In the embodiments of FIGS. 10-13, a planetary gear train is used to rotate and revolve the chucks 102. However, the same effects can be achieved with a transmission mechanism using rollers, belts, chains, or other members instead of gears to transmit rotation.

The support arm 104 need not have the shape illustrated in the figures. For example, instead of being bar-shaped, it can be in the form of a plate or disc. A disc-shaped support arm 104 is particularly advantageous in that it produces less disturbance of the air flow inside the cup 170.

The annular coupling 114 which connects the first and second oil pipes 143 and 144 to the oil passageways 136 and 137 within the rotating shaft 103 and the coupling 220 which connects the air discharge pipe 221 with the air discharge passageway 210a within the transmission shaft 210 need not have the structure shown in FIGS. 10 through 13, and their locations and shapes can be changed as long as their functions are not affected.

In the embodiments of FIGS. 12 and 13, only gears 161 and 164 are housed in the enclosed space 207 within the support arm 104. If the motors 152 and 166 and gears 154 and 151 are also housed within an enclosed space which is kept at negative pressure, the dust and other contamination which is generated by these members can be prevented from reaching the substrate 102, resulting in a coated film of higher quality.

FIGS. 16 and 17 illustrate a sixth embodiment of the present invention. The overall structure of this embodiment is similar to that of the embodiment of FIG. 12, and it differs from that embodiment mainly with respect to the structure of the cup 270 which covers the chucks 102. FIG. 17 is a vertical cross-sectional view of the cup 270. It includes an outer cup half 271 and a concentric inner cup half 272 which is separated from the outer cup half 271 by an upper annular opening 273 and a lower annular opening 279. A downwardly-extending outer drain 274 is secured to the outer periphery of the outer cup half 271, and a downwardly-extending inner drain 275 is secured to the center of the bottom surface of the inner cup half 271. The inside of the inner drain 275 communicates with the space between the inner and outer cup halves 271 and 272 through a plurality of ports 276 formed in the inner peripheral wall of the inner cup half 272. The bottom surface of the inner cup half 272 slopes downwardly towards the inner drain 275, while the bottom surface of the outer cup half 271 slopes downwardly towards the outer periphery of the outer cup half 271.

As shown in FIG. 16, the cup 270 fits over the top of the support arm 104, and the upper ends of the spindles 109 extend through the lower annular opening 279 of the cup 270. The inner drain 275 extends downwards through a longitudinal through hole 205a formed in the center of the upper half 205 of the support arm 104 and a longitudinal through hole 210a formed in the transmission shaft 210 to the exterior of the spin coating apparatus. A seal 277 is provided between the outer peripheral surface of the inner drain 275 and the inner peripheral surface of the through hole 205a to prevent coating material from flowing into the inside of the support arm 104.

The left and right sections of passageways 104a, 134, and 135 in FIG. 16 are connected with one another by pipes 208 which extend around the periphery of the through hole 205a.

One or more nozzles 171 for supplying coating material extend through the upper annular opening 273 in the cup 270. The structure of this embodiment is otherwise the same as that of the embodiment of FIG. 12.

Spin coating is performed using the embodiment of FIG. 16 is essentially the same manner as with the embodiment of FIG. 12. Excess coating material which is thrown off the substrates 101 during their rotation or revolution strikes the walls of the cup 270 and flows downwards. The coating material which strikes the inner wall of the outer cup half 271 flows downwards into the outer drain 274 and is removed from the apparatus. On the other hand, coating material which strikes the inner wall of the inner cup half 272 flows downwards into the inner drain 275 via the ports 276 and is likewise discharged to the outside of the apparatus. As the bottom surfaces of the outer cup half 271 and the inner cup half 272 nearly entirely cover the upper surface of the support arm 104, the support arm 104 contamination of by coating material prevented more effectively than in the embodiment of FIG. 12. A small amount of coating material can reach the support arm 104 by flowing through the lower annular opening 279 of the cup 270. However, on account of the seal 277 between the inner drain 275 and the support arm 104, coating material can be prevented from entering into the enclosed space 207 inside the support arm 104.

Spin coating can be performed using this embodiment in essentially the same manner as with the embodiment of FIG. 12.

During the operation of the embodiment of FIG. 16, when spin coating is not performed continuously, the solvent in the coating material which is thrown against the inner walls of the cup 270 by the rotation of the chucks 102 can vaporize, as a result of which the coating material will dry and harden to form a film on the inside walls of the cup 270. Over time, the thickness of the hardened film will increase, and when the film reaches a certain thickness, pieces of the film can fall off the walls of the cup 270 onto substrates 101 which are mounted on the chucks 102, causing defects in the substrates 101. To prevent this from occurring, it is necessary to clean the inner surface of the cup 270, which is troublesome and time-consuming.

Figure 18:
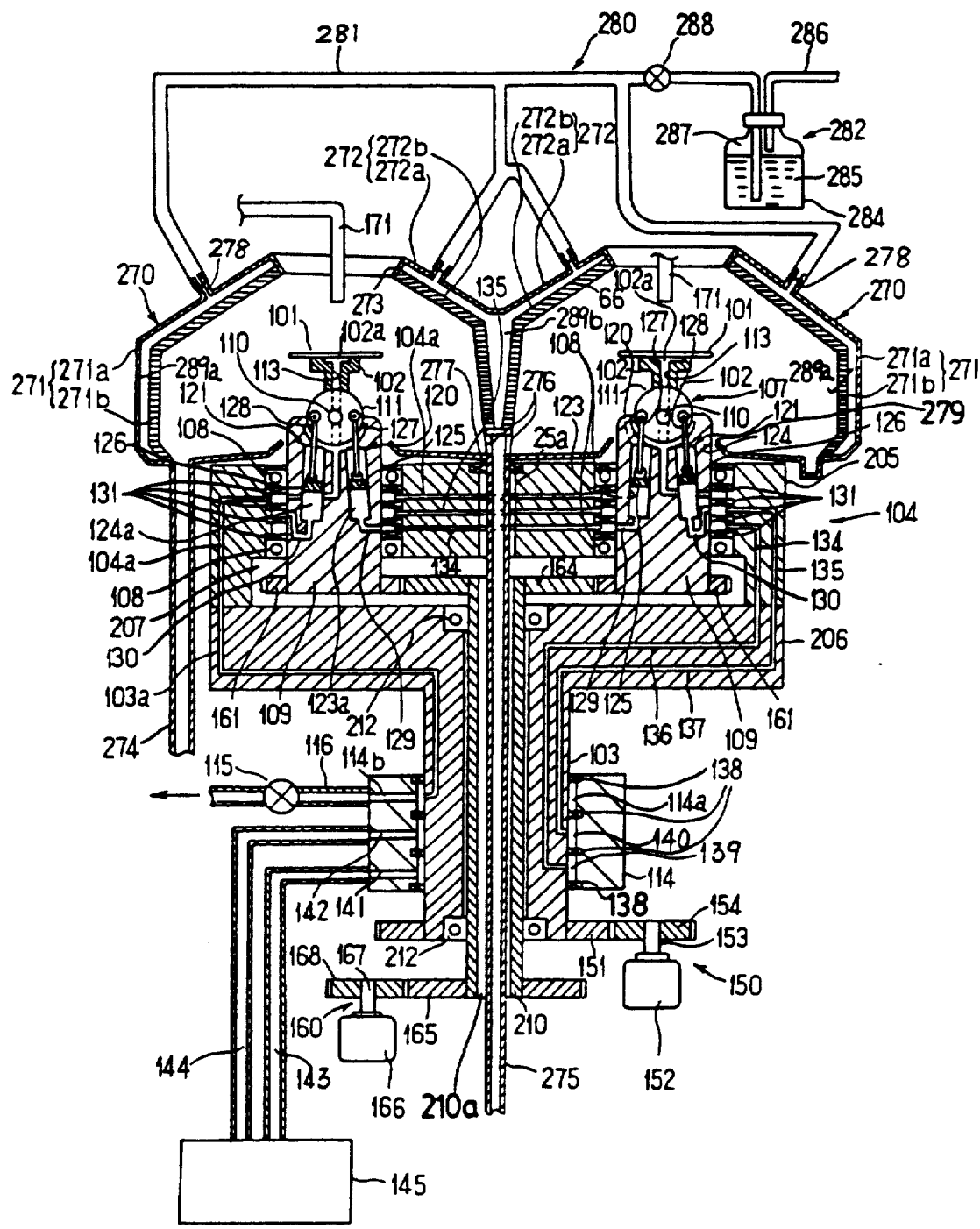
FIG. 18 is a vertical cross-sectional view of a seventh embodiment of a spin coating apparatus according to the present invention.

The accumulation of a hardened film of coating material on the inner walls of a cup 270 is prevented in a seventh embodiment of a spin coating apparatus according to the present invention, which is illustrated in FIGS. 18–20. This embodiment is equipped with a solvent supply mechanism which automatically cleans off the inner walls of a cup using a solvent and prevents the accumulation of a hardened film of coating material on the inner walls of the cup. The overall structure of this embodiment is similar to that of the embodiment of FIG. 16. However, the cup 270 of this embodiment has double walls. As shown most clearly in FIG. 19, which is a vertical cross-sectional view of the cup 270 of this embodiment, an outer cup half 271 has an outer wall 271a and an inner wall 271b which is separated from the outer wall 271a by a supply passageway 289a for solvent. Similarly, the inner cup half 272 has an outer wall 272a and an inner wall 272b which is separated from the outer wall 272a by a supply passageway 289b for solvent. The outer walls 271a and 272a are made of a solid sheet of a material which is impervious to liquid, such as stainless steel. In contrast, as shown in FIG. 20, which is an enlarged view of portion A of FIG. 19, the inner walls 271b and 272b of both cup halves 271 and 272 contain small-bore fluid passages 290 in the form of pores or through holes which allow solvent to pass through the inner walls. There are no restrictions on the material which is used for the inner walls 271b and 272b as long as it allows the passage of liquid therethrough and is resistant to corrosion by the solvent employed in the coating material. Some examples of suitable materials are expanded urethane, sintered aluminum, and ceramics. The inner walls 271b and 272b can also have a honeycomb structure which allows the passage of liquid. Alternatively, the passages 290 can be through holes which are mechanically formed in the inner walls 271b and 272b. If the outer walls 271a and 272a are sufficiently strong, they can be used to support the inner walls 271b and 272b, and the inner walls need not be of great strength.

The number and size of the passages 290 is not critical, but preferably they are distributed over the entirety of the inner walls so that a solvent can be supplied to the entire inner surface of the side walls of the cup 270.

A plurality of inlets in the form of nipples 278 are formed on the outer surfaces of the outer walls 271a and 272a of the cup 270. The nipples 278 open onto the insides of the passageways 289a and 289b for solvent and are connected to a solvent supply mechanism 280 which is similar to that employed in the embodiment of FIG. 7. The solvent supply mechanism 280 includes a sealed vessel 282 containing a solvent 285. The vessel 285 is connected to the nipples 278 by piping 281 via a flow control valve 288 such as a solenoid valve. One end of the piping 281 is submerged in the solvent 285 inside the vessel 282. Compressed gas such as compressed air or nitrogen from an unillustrated gas supply is supplied to the inside of the vessel 282 by a pipe 286 which extends into the vessel 282. The compressed gas maintains the space 287 inside the vessel 282 above the surface of the solvent 285 at above atmospheric pressure. When the valve 288 is opened, the solvent 285 within the vessel 282 is forced through the piping 281 by the compressed gas and flows through the nipples 278 into the supply passageways 289a and 289b. Once inside the supply passageways 289a and 289b, the solvent gradually flows through the passages 290 in the inner walls 271b and 272b of the cup 270 and moistens the inner surfaces of the inner walls with solvent. The solvent dissolves any coating material adhering to the inner surfaces of the inner walls, and the dissolved coating material is washed off the walls by the solvent and flows downwards into the drains 274 and 275. Therefore, coating material can be prevented from hardening on the inner walls of the cup 270, and the inner walls can always be kept clean.

Some of the solvent 285 which flows through the inner walls of the cup 270 vaporizes. During spin coating, if the nozzles 171 are withdrawn from the inside of the cover 270 and the upper annular opening 273 is covered by an unillustrated lid (such as the one employed in the embodiment of FIG. 7), the solvent vapor can be prevented from escaping and an atmosphere of solvent vapor can be formed inside the cup 270. As explained with respect to the embodiment of FIG. 7, a solvent vapor atmosphere suppresses the hardening of the coating material during spin coating and enables the formation of a smooth coated surface without undulations.

In the embodiment of FIG. 18, the supply passageways 289a and 289b extend only around the top and sides of the cup 270. However, it is possible to design the cup 270 so that the passageways 289a and 289b extend along the bottom surface of the cup 270 as well, whereby the bottom of the cup 270 can also be continuously cleaned with solvent.

Any solvent which is capable of dissolving the coating material can be employed for cleaning the inner surface of the cup 270. For example, it can be the same as the solvent contained in the coating material. It is also possible to employ a plurality of solvents which are separately supplied to the inside of the cup 270 by separate solvent supply mechanisms 280 connected to individual supply passages 289a and 289b. Alternatively, a mixture of solvents can be supplied by a single supply mechanism 280.

Figure 21:
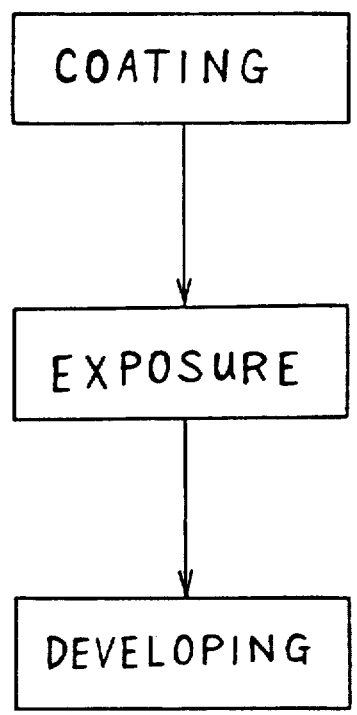
FIG. 21 is a flow chart of the steps in forming a resist pattern using a spin coating apparatus according to the present invention.

Next, a method of forming a resist pattern on a semiconductor substrate using the spin coating apparatus of the present invention will be described. FIG. 21 is a flow chart of the basic steps of this method, and FIG. 22 shows the cross-sectional shape of a resist pattern at different stages in its formation on a semiconductor substrate. As shown in FIG. 21, the method comprises forming a resist film on the substrate by spin coating, exposing a portion of the resist film to light, and then developing the resist film to form a pattern.

Figures 22A, 22B, 22C, 22D:
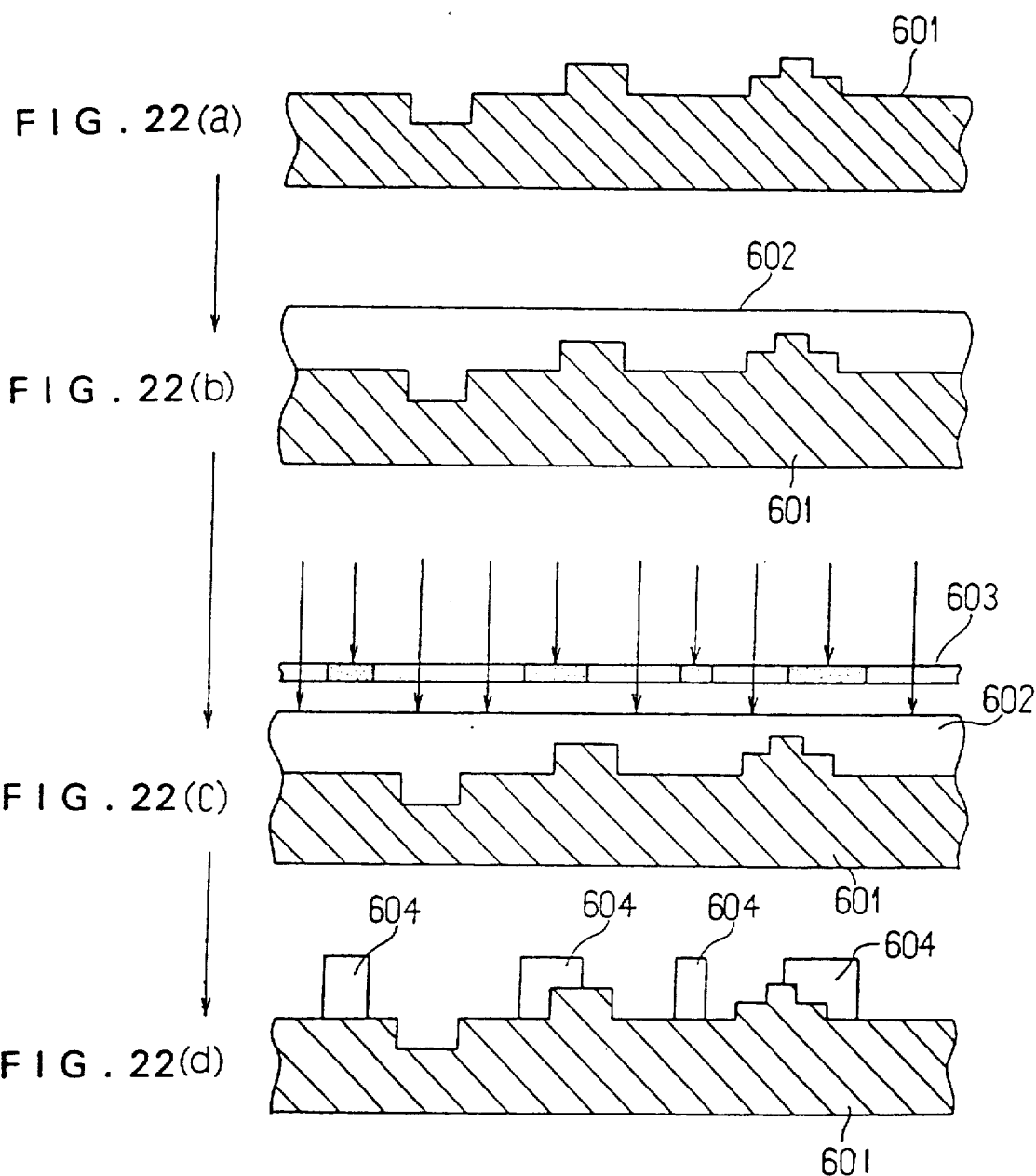
FIGS. 22a, 22b, 22c and 22d are cross-sectional views of a silicon substrate at different stages during the formation of a resist pattern.

FIG. 22a shows the shape of the surface of a substrate 601 at the start of the method. The surface of the substrate 601 has irregularities in the form of dicing lines and projections. As shown in FIG. 22b, a flat resist film 602 is then formed on the substrate 601 using the apparatus of the present invention in the manner previously described. The coating conditions such as the tilt angle, the speed of rotation, and the speed of revolution of the substrate 601 are suitably controlled so that the resulting resist film 602 will be completely flat, regardless of the irregularities in the surface of the substrate 601.

Next, as shown in FIG. 22c, a mask 603 having a desired pattern formed in it is disposed above the resist film 602, and light (typically ultraviolet light) is passed through the mask 603 to expose suitable portions of the resist film 602.

The resist film 602 is then developed, and a desired resist pattern 604 is obtained. Because of the smoothness and flatness of the resist film 602, the resulting resist pattern 604 has a high dimensional accuracy and a uniform width, despite the irregularities in the surface of the substrate 601 itself.

Figure 23:
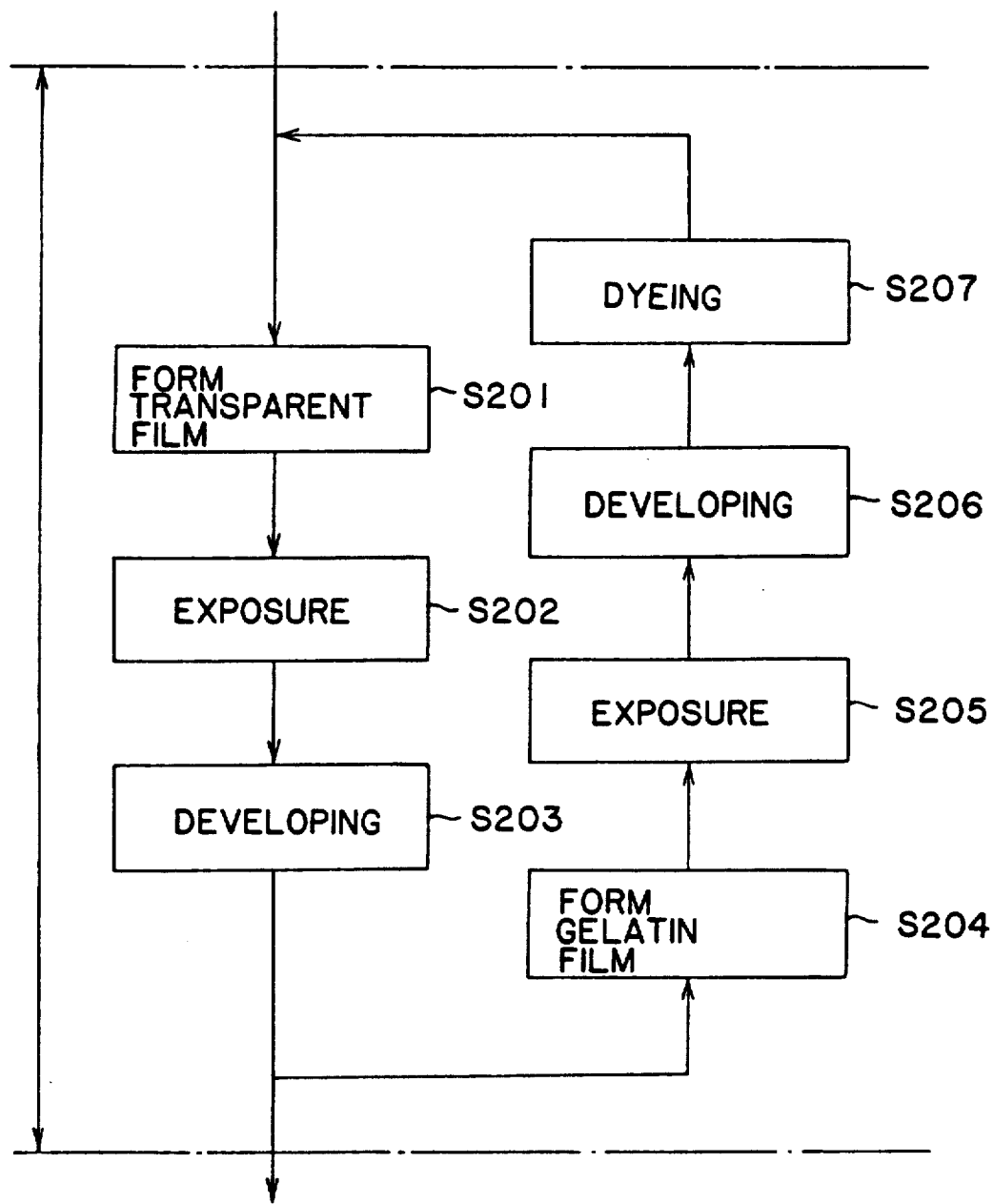
FIG. 23 is a flow chart of a method of forming a color filter using a spin coating apparatus according to the present invention.
Figure 24:
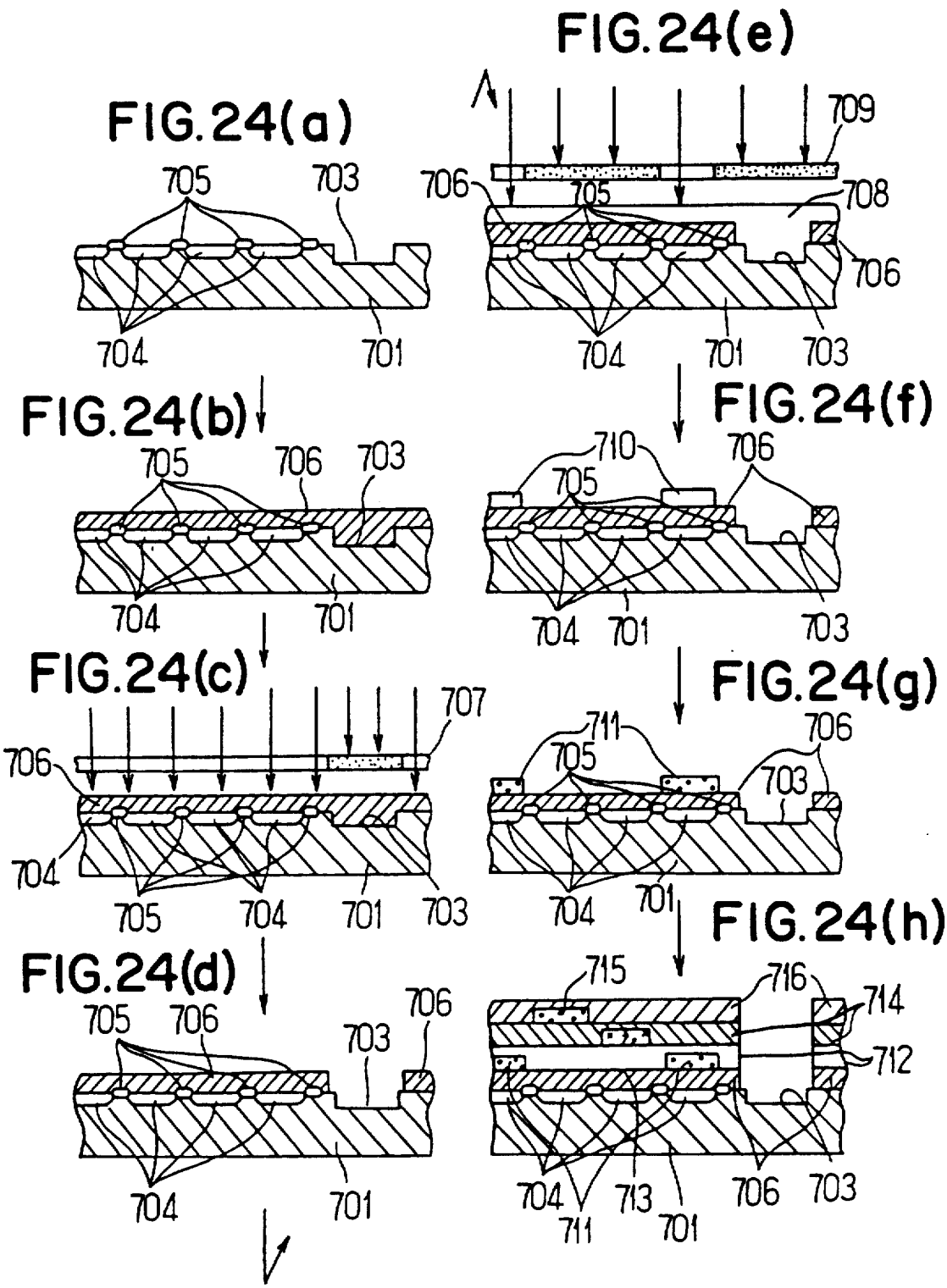

Next, a method of manufacturing a color filter on a semiconductor substrate using the spin coating apparatus of the present invention will be described while referring to FIGS. 23 and 24. FIG. 23 is a flow chart of this method, and FIG. 24 is a cross-sectional view of the surface of a substrate 701 during various stages of the method. The substrate 701 has a solid picture element such as a CCD formed on it. FIG. 24a shows the surface of the substrate 701 at the start of the method. The surface of the substrate 701 is irregular due to the presence on the substrate 701 of dicing lines 703, light-sensitive elements such as photodiodes 704, and oxide films 705 which separate the photodiodes 704. First, in order to form a smooth surface on the substrate 701, in Step S201, a light-sensitive transparent film 706 is formed on the surface of the substrate 701 by spin coating using the apparatus of the present invention. The spin coating conditions are controlled in the manner described above so that the film 706 will be completely smooth and flat. In the present embodiment, the transparent film 706 is made of a photonegative material so that it can be patterned by optical lithography. Next, in Step S202 and as shown in FIG. 24c, the transparent film 706 is exposed to light of a suitable wavelength through a mask 707 having a suitable pattern which covers those areas, such as the dicing lines 703 and unillustrated bonding pads, where the transparent film 706 is not necessary. Next, in Step S203, the transparent film 706 is developed, and those portions of the film 706 which were not exposed are removed, as shown in FIG. 24d.

Next, in Step S204, a gelatin layer 708 is formed on the transparent film 706 by spin coating using the apparatus of the present invention. The gelatin is previously treated with a substance such as ammonium dichromate to make it photonegative. In Step S205 and as shown in FIG. 24e, the gelatin film 708 is exposed to light of a suitable wavelength using a mask 709 which covers those portions of the gelatin layer 708 which are to be removed. Next, in Step S206, the gelatin layer 708 is developed, and those portions which were not exposed in Step S205 are removed to leave a gelatin pattern 710, as shown in FIG. 24f. In Step S207, the gelatin pattern 710 is dyed with a prescribed red dye to obtain a red filter 711, as shown in FIG. 24g.

Figure 25:
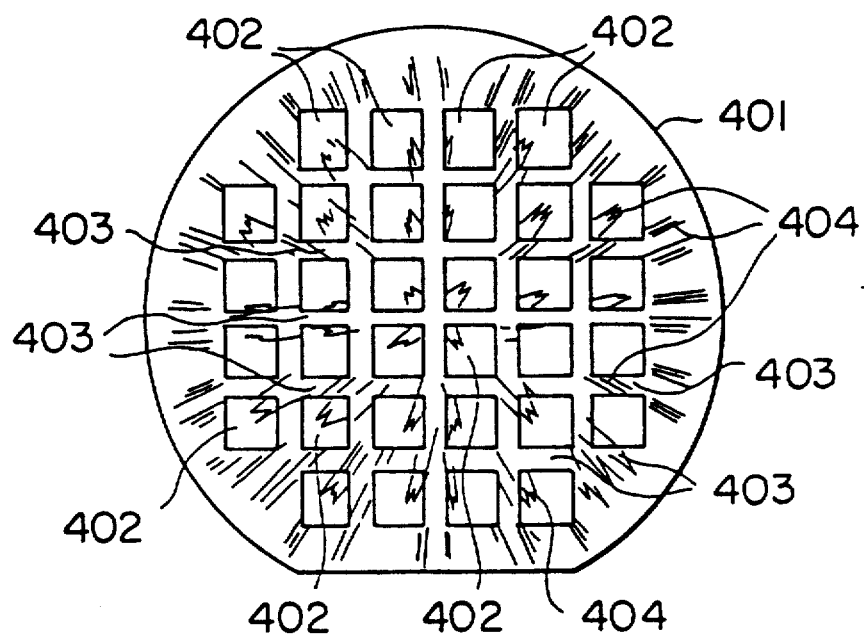
FIG. 25 is a plan view of a semiconductor wafer which has been coated with a coating material by a conventional spin coating method.
Figure 26A:
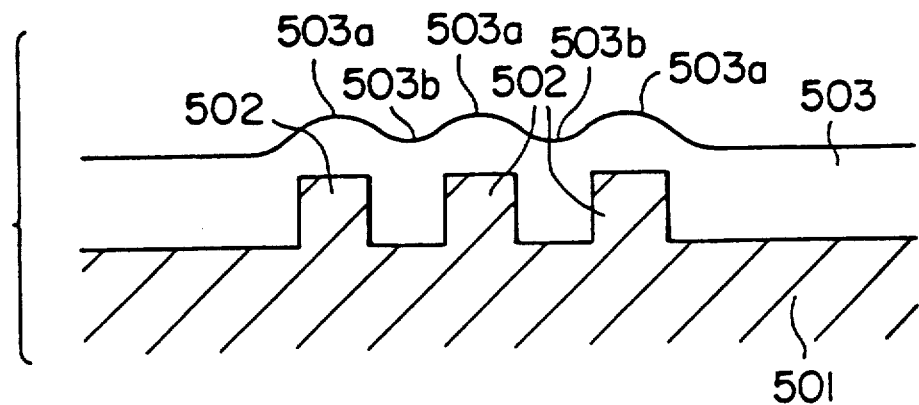
FIGS. 26a, 26b and 26c are cross-sectional views of the surfaces of three different substrates which have been coated with a coating material by a conventional spin coating method.
Figure 26B:
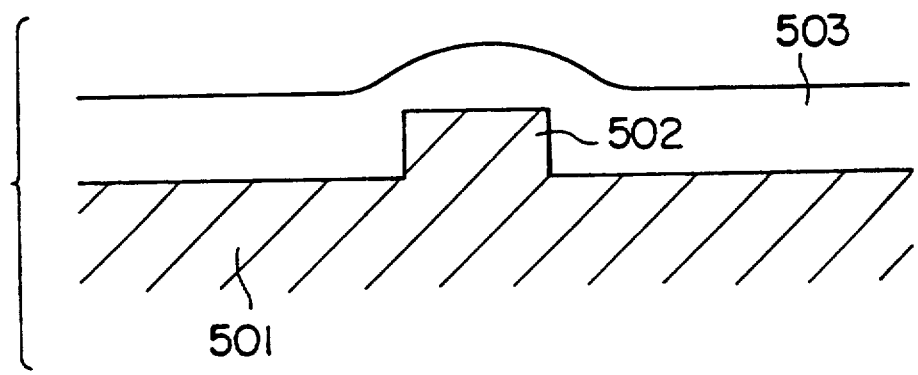
Figure 26C:
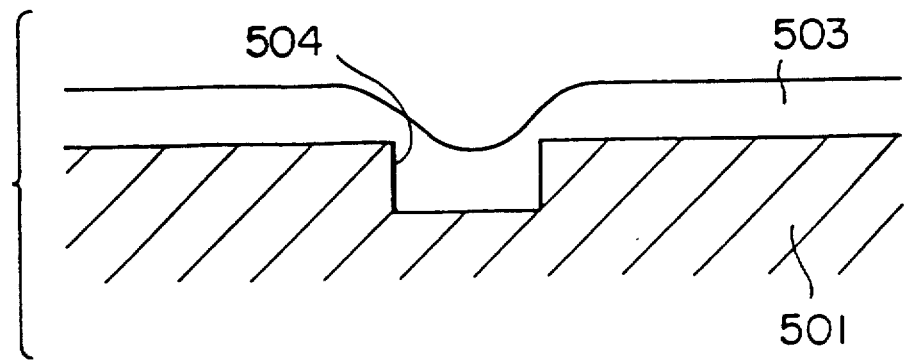

Steps S201 through S207 are then repeated as many times as are necessary to obtain the desired number of filters. FIG. 25h shows a seven-layer color filter which was formed in the above-described manner. It includes, from bottom to top, a substrate 701, a lower transparent film 706, a red filter 711, a first intermediate transparent film 712, a blue filter 713, a second intermediate transparent film 714, a green filter 715, and a protective upper transparent film 716. The intermediate transparent films 712 and 714 provide flat surfaces for the formation of the blue filter 713 and the green filter 715.

Films 706, 712, 714, and 716 and the films from which the filters 711, 713, and 715 are patterned are preferably formed using the spin coating apparatus of the present invention because of the superior flatness and smoothness which can be obtained. However, it is of course possible to form only a portion of these films using the apparatus of the present invention and to form the remaining films using a conventional coating apparatus.

The color filter of FIG. 24 is just one example of a filter which can be manufactured using the spin coating apparatus of the present invention, and many other types of filters can also be produced. For example, the filter need not be a red-blue-green filter, but can be a filter for complementary colors. The substrate 701 of FIG. 24 has a solid picture element formed on it, but a bare silicon substrate or a transparent substrate of glass, quartz, or other material can instead be used. It is also possible to omit one or more of the transparent layers between the color filter layers after dyeing the gelatin, and one or both of films 706 and 716 can be omitted. The various layers can be formed from a material which is photopositive or photonegative, or they can be formed from a material which is not light-sensitive, such as a thermosetting material, and unneeded portions can be removed by etching or other means. Instead gelatin, other materials capable of being dyed, either natural or synthetic, can be employed to form the filter layers, some examples of which are casein, glue, and polyvinyl alcohol. A pigment or the like can also be used as a coloring material. Thus, a spin coating apparatus and method according to the present invention can be used to manufacture virtually any type of filter.

What is claimed is:

1. A spin coating method comprising:
 applying a liquid coating material to a substrate; and
 after applying the coating material to the substrate, rotating the substrate about a first axis generally perpendicular to the substrate and revolving the substrate about a second axis while tilting the substrate relative to the second axis.

2. A spin coating method as claimed in claim 1, comprising revolving the substrate about the second axis while rotating the substrate about the first axis.

3. A spin coating method as claimed in claim 1, including rotating the substrate in an atmosphere containing a solvent vapor.

4. A spin coating method as claimed in claim 3 including introducing the vapor of the solvent into a chamber surrounding the substrate.

5. A spin coating method as claimed in claim 4 wherein the coating material contains a solvent including producing the solvent vapor in the chamber from the same solvent that is contained in the coating material.

6. A spin coating method as claimed in claim 1, including tilting the substrate such that the vector sum of gravity and centrifugal force acting on the coating material is substantially perpendicular to the the substrate.

7. A spin coating method as claimed in claim 1 including revolving the substrate at a first speed to smooth the coating material and revolving at a second speed, lower than the first speed, to dry the coating material.

8. A spin coating method comprising:
 rotating a substrate having a liquid coating material on a surface thereof about a first axis to spread the coating material over the surface; and
 revolving the substrate about a second axis while tilting the substrate relative to the second axis.

9. A spin coating method as claimed in claim 8 wherein the first and second axes are parallel.

10. A spin coating method as claimed in claim 8 wherein the first axis intersects the substrate at a point spaced from the second axis.

* * * * *